US012666541B2

(12) United States Patent
Hall et al.

(10) Patent No.: US 12,666,541 B2
(45) Date of Patent: Jun. 23, 2026

(54) TENSIONED PRINTING SCREEN FRAME, ASSEMBLY AND METHOD

(71) Applicant: TANNLIN TECHNOLOGY LIMITED, Kilmarnock (GB)

(72) Inventors: James S. Hall, Prestwick (GB); James G. Hall, Prestwick (GB); Jake Gillespie, Prestwick (GB)

(73) Assignee: TANNLIN TECHNOLOGY LIMITED, Kilmarnock (GB)

( * ) Notice: Subject to any disclaimer, the term of this patent is extended or adjusted under 35 U.S.C. 154(b) by 845 days.

(21) Appl. No.: 17/910,897

(22) PCT Filed: Mar. 8, 2021

(86) PCT No.: PCT/GB2021/050571
§ 371 (c)(1),
(2) Date: Sep. 12, 2022

(87) PCT Pub. No.: WO2021/181075
PCT Pub. Date: Sep. 16, 2021

(65) Prior Publication Data
US 2023/0135873 A1 May 4, 2023

(30) Foreign Application Priority Data
Mar. 13, 2020 (GB) ..................................... 2003671

(51) Int. Cl.
*B41F 15/36* (2006.01)
*B05C 17/08* (2006.01)
(Continued)

(52) U.S. Cl.
CPC ........... *H05K 3/1225* (2013.01); *B05C 17/08* (2013.01); *B41F 15/36* (2013.01); *B41C 1/145* (2013.01); *B41C 1/147* (2013.01); *B41P 2215/10* (2013.01)

(58) Field of Classification Search
None
See application file for complete search history.

(56) References Cited

U.S. PATENT DOCUMENTS

| | | | | |
|---|---|---|---|---|
| 5,136,797 | A | 8/1992 | Hildebrandt | |
| 5,957,048 | A | 9/1999 | Newman, Jr. | |
| 6,038,969 | A * | 3/2000 | Podlipec | B41N 1/248 |
| | | | | 101/127 |

FOREIGN PATENT DOCUMENTS

| | | | | |
|---|---|---|---|---|
| CN | 1230147 | A | 9/1999 | |
| CN | 108437614 | A * | 8/2018 | B41F 15/36 |

(Continued)

OTHER PUBLICATIONS

English translation of CN 108437614 A, publication date Aug. 24, 2018. (Year: 2018).*

(Continued)

*Primary Examiner* — Leslie J Thompson
(74) *Attorney, Agent, or Firm* — MOSER TABOADA

(57) ABSTRACT

Disclosed is a printing screen assembly, a frame for a printing screen and method for their construction. The printing screen assembly has a frame (310) with an elongate first frame member (320, 320a) and an elongate second frame member (320, 320b) parallel to the first frame member (320, 320a) and in fixed relation thereto; and a corresponding cantilevered first and second tensioning arrangement (326) extending from each frame member (320) along a length thereof. A predictable pre-tensioning force may be applied by resiliently deflecting the tensioning arrangements (326) into contact with an abutment arrangement (328) and securing a printing screen to an attachment portion (326b) of the first tensioning arrangement (326a), while the first tensioning arrangement (326) is in contact with the first abutment arrangement (326a). The frame may be formed by preselecting the resilience of the tensioning arrangement (Continued)

(326) so as to preselect the tension applied when tensioning a printing screen in use.

13 Claims, 12 Drawing Sheets

(51) Int. Cl.
   *H05K 3/12*          (2006.01)
   *B41C 1/14*          (2006.01)

(56)                    References Cited

FOREIGN PATENT DOCUMENTS

| DE | 102005054225 A1 | 5/2007 |
| EP | 1308275 A1 | 1/2004 |
| GB | 2371520 A | 7/2002 |
| GB | 2431899 A1 | 5/2007 |
| GB | 2532050 A | 5/2016 |
| JP | 2002210916 A | 7/2002 |
| JP | 2019-514736 A | 6/2019 |
| KR | 101765120 B1 | 8/2017 |
| WO | WO 2005/046994 A2 | 5/2005 |
| WO | WO 2013/110685 A1 | 8/2013 |
| WO | WO 2019/103284 A1 | 5/2019 |

OTHER PUBLICATIONS

English translation of EP 1308275 A, publication date May 7, 2003. (Year: 2003).*
GB Search Report for Application No. GB2003671.1 dated for Sep. 14, 2020.
GB Search Report for Application No. GB2003671.1 dated for Apr. 13, 2021.
International Search Report and Written Opinion for PCT/GB2021/050571 dated for May 12, 2021.

* cited by examiner

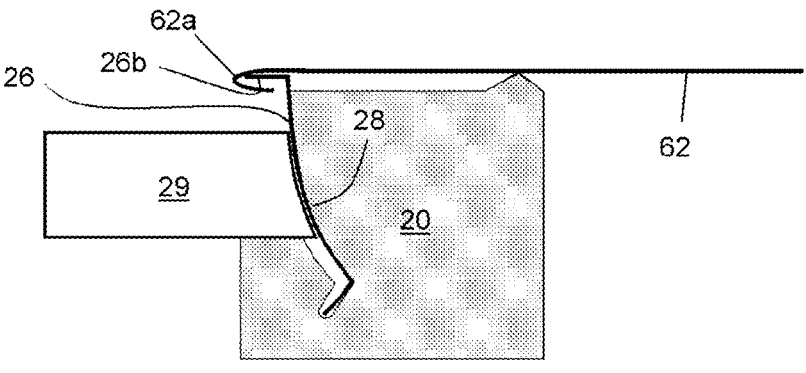
Figure 9
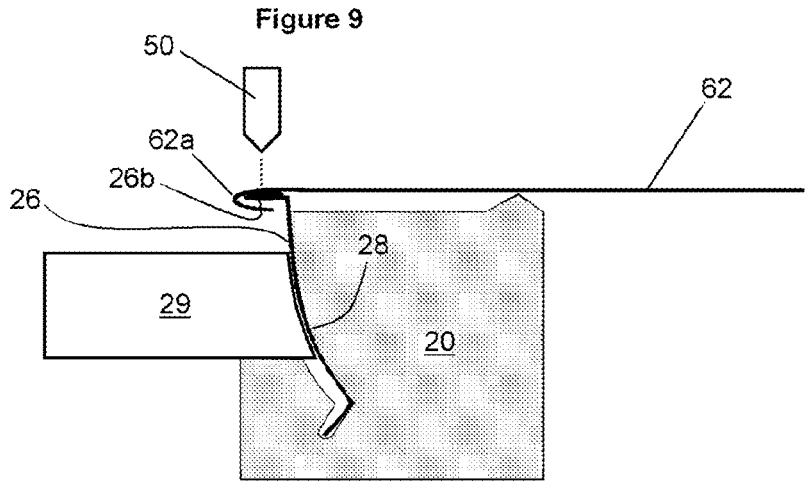
Figure 10
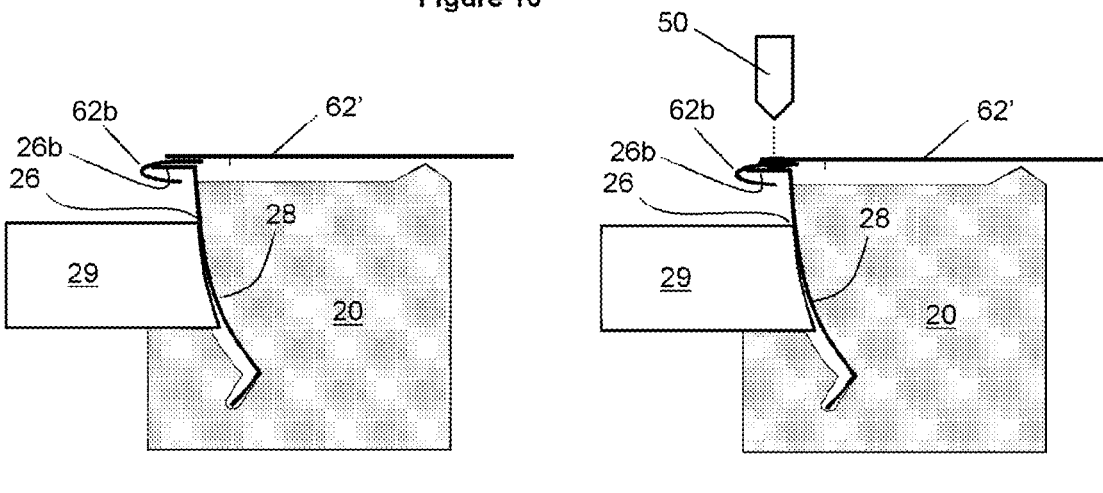
Figure 11                                    Figure 12

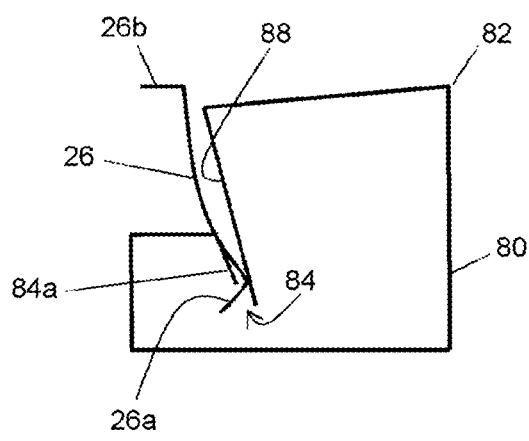
Figure 13
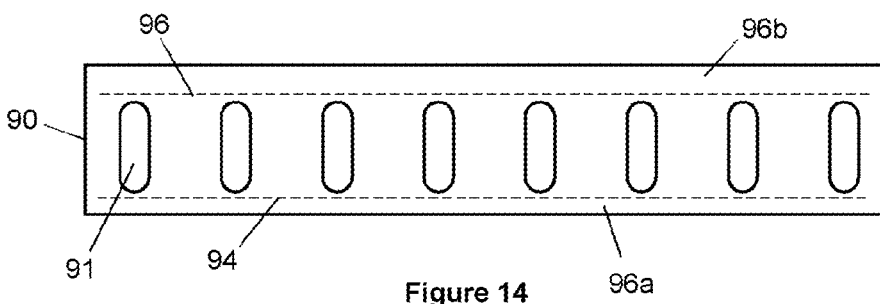
Figure 14
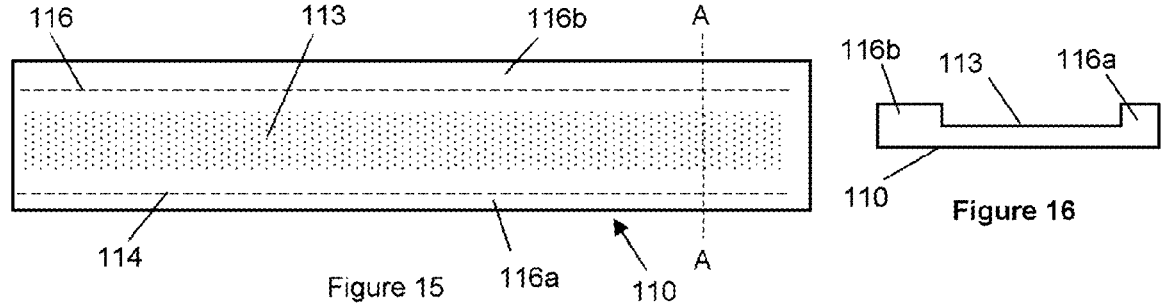
Figure 15
Figure 16
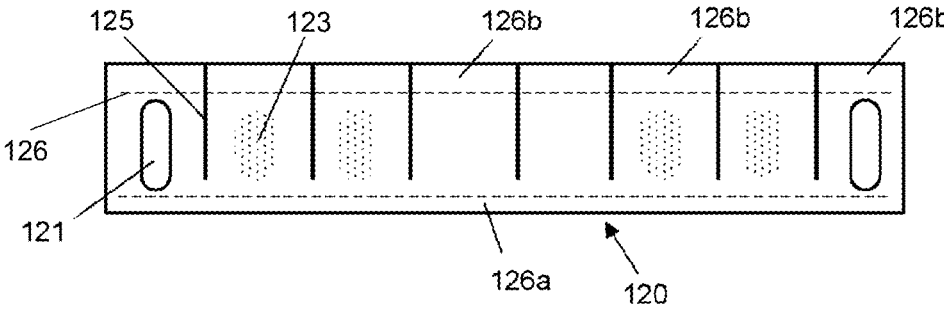
Figure 17

TENSIONED PRINTING SCREEN FRAME, ASSEMBLY AND METHOD

FIELD OF THE INVENTION

The invention relates to the field of high screen printing, in particular for high precision applications such as solder paste printing.

BACKGROUND TO THE INVENTION

Screen printing is used in a range of industries to print an image onto a substrate. A printing screen having apertures defining a negative of the image is tensioned within a frame and placed on a substrate and an ink or other printing medium distributed across the printing screen by passing a roller or blade (sometimes referred to as a squeegee) over the surface of the printing screen, such that the printing medium flows through the aperture(s) and the image is printed on the substrate.

In certain technical applications, screen printing methods are used which require a high degree dimensional precision, and accurate printed feature definition. For example, high precision screen printing is used to print electronic features such as those required for modern batteries or printed electronics, sensor features, photovoltaic features and the like.

Conventional precision screen printing is conducted using an emulsion screen. A mesh material (typically a woven steel or titanium mesh) having a suitable mesh size is selected, and a printing screen constructed in which the mesh is held in tension within a rigid frame. A layer of a photosensitive polymer-precursor solution or suspension is applied to the mesh. The photosensitive polymer is selectively cured to create a negative of the required printing pattern (for example using a UV laser, using a pre-cut sheet or mask or the like) and the uncured precursor washed away, to leave the desired printing pattern defined on the screen by bare areas of mesh bounded by a mask.

In alternative applications such as in printing of solder patterns onto circuit board substrates, a sheet material such as a polymer or more typically a metal sheet material is used, in which a pattern is precision cut (e.g. by laser cutting) into the sheet material.

A mesh or sheet printing screen must be tensioned to maintain the mesh as flat as possible, to avoid pooling of printing medium when the screen is removed after printing. The screen is therefore tensioned (before, or after the pattern is created in the printing screen) by stretching and securing to a frame while under tension.

Whilst this arrangement is relatively straightforward to tension a mesh or sheet printing screen, the resulting printing screen and frame assembly is relatively bulky and so can be problematic to store a library of printing screen assemblies. In addition, it is often impracticable or not possible to remove the printing screen from the frame without damage, particularly the thin sheets required for precision printing, leading to high materials and recycling costs.

Solutions have been proposed in which a screen is removably mounted to a frame. For example, DE102005054225 describes a sheet metal printing screen with an array of perforations around the periphery, which are secured to a supporting frame is provided with spring-biased pins corresponding to the array of perforations. Whilst this arrangement allows for the frame to be re-used, the frame itself is mechanically complex and costly to manufacture. Mounting and demounting of the printing screen is also relatively time consuming due to the required precise alignment of the apertures and pegs. Additionally, the tension applied by the frame to the screen cannot be readily adjusted to particular requirements.

WO2005046994 describes a removably mounted screen and frame, in which a sheet metal screen is provided with a lip along each edge, to be hooked on to a movable member within the frame. The movable members are then biased by pressurising a bladder within the frame so as to tension the screen. Whilst this approach is both mechanically simpler and easier to use, the frame requires ongoing maintenance of the pneumatic system and the amount of tension is limited by the strength of the hook arrangement around the screen periphery. This can be particularly problematic for very thin screen materials. Whilst the tension applied by the frame to the screen can be adjusted to some degree by varying air pressure, the correlation is relatively coarse.

Removable screens of this general type are also prone to damage, for example during storage. This can be particularly problematic for extremely thin "foil" screens for high precision applications requiring sub-micron printing accuracy.

A further drawback of such removable screen assemblies is that some steps of their use are susceptible to automation.

Accordingly, there remains a need for improvements in high-precision screen printing.

SUMMARY OF THE INVENTION

According to a first aspect of the invention there is provided a method of constructing a printing screen assembly, comprising:

providing a frame having an elongate first frame member and an elongate second frame member parallel to the first frame member and in fixed relation thereto; and a corresponding cantilevered first and second tensioning arrangement extending from each frame member along a length thereof;

applying a pre-tensioning force to resiliently deflect the first tensioning arrangement towards the second frame member and into contact with an abutment arrangement of the first frame member;

securing a printing screen to an attachment portion of the first tensioning arrangement, while the first tensioning arrangement is in contact with the first abutment arrangement;

securing the printing screen to an attachment portion of the second tensioning arrangement; and releasing the pre-tensioning force from the first tensioning arrangement so as to apply tension to the printing screen.

Deflection of the first tensioning arrangement until it contacts the first abutment arrangement introduces a predictable amount of elastic potential energy, or "pre-tensioning" to the apparatus. Upon release, the tensioning arrangement is biased towards its undeflected "at rest" position, such that the printing screen is held in tension between the first and second tensioning arrangements. The amount of tension applied to the printing screen is related to the amount of elastic potential energy introduced by deflecting the first tensioning arrangement.

It will be understood that the length of the respective frame member along which the tensioning arrangement extends corresponds in use to a length of an edge of the tensioned printing screen.

The method may comprise resiliently deflecting the second tensioning arrangement towards the first frame member and into contact with a second abutment arrangement of the second frame member; securing the printing screen to an attachment portion of the second tensioning arrangement while the at least one second tensioning arrangement is in contact with the second abutment arrangement; and releasing the pre-tensioning force from the at least one second tensioning arrangement.

The steps of deflecting the first tensioning arrangement; optionally deflecting the second tensioning arrangement; securing the printing screen to the attachment portion of the first tensioning arrangement; and securing the printing screen to the attachment portion of the second tensioning arrangement; may be conducted in any suitable sequence.

In some embodiments, the printing screen is attached when the respective pre-tensioning has been applied (to one or both of the first and second tensioning arrangements).

The pre-tensioning force can also be released in any sequence.

The method may comprise tensioning the printing screen in a single direction (i.e. between the first and second frame members).

The method may comprise tensioning the printing screen in two directions.

Accordingly, the frame may comprise an elongate third frame member and an elongate fourth frame member parallel to the third frame member; and a corresponding cantilevered third and fourth tensioning arrangement extending from each of the third and fourth frame members along a length thereof; wherein the third and fourth frame members extend generally between and orthogonal to the first and second frame members;

wherein the method further comprises applying a pre-tensioning force to resiliently deflect the third tensioning arrangement towards the fourth frame member and into contact with a third abutment arrangement of the third frame member; and applying a pre-tensioning force to resiliently deflect the fourth tensioning arrangement towards the third frame member and into contact with a fourth abutment arrangement of the fourth frame member;

securing a printing screen to an attachment portion of the third and the fourth tensioning arrangement, while the pre-tensioning force is applied thereto; and releasing the pre-tensioning force from the third tensioning arrangement so as to apply tension to the printing screen.

The various steps of deflecting the/each tensioning arrangement and securing the printing screen to the attachment portions thereof, may be conducted in any suitable sequence.

In some embodiments, the printing screen is attached when all of the respective pre-tensioning has been applied to the first and optionally second and/or third and/or fourth tensioning arrangement, as the case may be.

In some embodiments comprising first through fourth frame members, the printing screen is attached to the attachment portions of the first and second tensioning arrangements when the pre-tensioning force has been applied to the first and optionally the second tensioning arrangement. The pre-tensioning force may then be released so as to tension the printing screen between the first and second tensioning arrangements. The method may comprise subsequently applying a pre-tensioning force to the third and fourth tensioning arrangements.

Each tensioning arrangement comprises at least one tensioning element. Each tensioning arrangement may independently comprise two or more tensioning elements; for example, in a series along the respective frame member; or a single elongate tensioning element.

Each abutment arrangement may independently comprise two or more abutments, for example in a series along the respective frame member; or a single elongate abutment.

The number of abutments and tensioning elements along the length of a frame member may be the same, or different. For example, a given tensioning element may be deflected into contact with more than one abutment, or more than one tensioning element may be deflected into contact with a given abutment.

The pre-tensioning force can be applied to the first tensioning arrangement by use of at least one first deflecting element. The method may comprise moving the at least one first deflecting element from a first side of the first frame member (i.e. from a side further from the second frame member than the first frame member—and thus from outside of the frame), towards the first frame member (and thus also the second frame member).

A single deflecting element, or multiple deflecting elements, may be used to deflect a given tensioning arrangement. The number of deflecting elements may be the same as or different to the number of tensioning elements. A deflecting element may be used to deflect more than one tensioning element, or more than one deflecting element may be used to deflect a tensioning element.

The method may comprise applying a pre-tensioning force to the second tensioning arrangement using at least one second deflecting element. The method may comprise moving the at least one second deflecting element from a second side of the second frame member (i.e. from a side further from the first frame member than the second frame member—and thus from outside of the frame), towards the second frame member (and thus also the second frame member).

The method may comprise use of at least one third and optionally at least one fourth deflecting element.

In some embodiments, where the frame comprises third and fourth frame members, the method may comprise rotating the frame so that the at least one first and second deflecting elements can be used to apply a pre-tensioning force to the third and fourth tensioning arrangements.

Movement of the deflecting elements can be achieved in any suitable manner; for example the deflecting element(s) may be electromechanically, pneumatically or hydraulically actuated.

Said deflecting element or elements will typically move generally in the plane of the frame (for example parallel to a reference edge).

A deflecting element may be sized to extend through an aperture of a finger guard. An end portion of a deflecting element may be sized to extend through an aperture in a tensioning arrangement. A deflecting element may comprise a tapered end portion and a ledge or flange. A tapered end portion may assist in alignment of the deflecting element with an aperture in a tensioning arrangement and optionally a corresponding aperture in an abutment arrangement. The ledge or flange may be dimensioned to engage the tensioning arrangement around a said aperture, or bridge across a said aperture.

Each tensioning arrangement comprises at least one tensioning element. Each tensioning element extends from a fixed end, coupled to the respective frame element, to a free end. The attachment portion of each tensioning element may be at or proximal to the free end of each tensioning element.

The method may comprise preselecting the tension applied by at least one of the first or second (and, where present third and/or fourth) tensioning arrangements.

The or each tensioning arrangement may comprise, or be formed from, a resilient sheet material such as a stainless steel. The tension applied by a said tensioning arrangement may be preselected by removing material from the resilient sheet material, machining and/or etching the resilient sheet material so as to selective reduce its thickness in one or more regions thereof. The tension applied by a said tensioning arrangement may be preselected by virtue of a distance between the tensioning arrangement in an "at rest" position and a corresponding abutment arrangement.

The thickness of the sheet material may be selectively reduced to control bending characteristics. Alternatively, or in addition, one or more slots, cut-outs, apertures or the like may be cut into or from the sheet material, to thereby control bending characteristics.

One or more slots or cut-outs may be cut into or from the sheet material to define two more tensioning elements.

The method may comprise forming apertures, cut-outs or regions of reduced thickness in any suitable pattern; for example, along an edge or apex around which bending occurs during pre-tensioning; on or across a face of a flexible region intermediate the fixed and free ends. Alternatively, or in addition, material may be removed between a fixed and free end of a said tensioning element, so as to control how a tensioning element flexes.

In some embodiments the apertures may correspond to apertures or recesses in the frame member (for example the abutment arrangement and/or a finger guard), to facilitate pre-tensioning using a deflecting element, as discussed in further detail below.

The method may comprise precision processing, such as laser machining or etching of the resilient sheet material. Other methods of machining or etching may be used, such as CNC machining, plasma machining or the like.

In some embodiments, the method may comprise varying the tension applied at least one said tensioning arrangement, along said length of the respective frame member.

The tension may be varied for example to provide for increased tension in the middle of the printing screen. A tensioned printing screen will tend to sag with distance from the points of lines of attachment to a frame, typically with distance from the corners of the frame. The method enables greater tension to be applied where required to counter such sagging.

The tension may be varied by varying the pattern of machining and/or etching along the respective tensioning arrangement. For example, a greater amount of machining and/or etching may be conducted to part of, or tensioning element of a tensioning arrangement closer to the corners of the frame.

Such preselection by machining and/or etching may conveniently be conducted during manufacture of the respective tensioning arrangement.

A frame member may comprise a non-linear abutment, or non-colinear abutments; and the tension may be varied by varying the amount by which the corresponding tensioning arrangement is deflected, along the length of the frame member.

A tensioning element may be formed from a resilient sheet material.

By "formed from a sheet of material" we refer herein to manufacture by bending, roll forming, stamping, pressing and the like. Manufacturing processes such as extrusion, moulding or casting are excluded. A tensioning element, frame member or other article formed from a sheet material will possess characteristics of the sheet material; such as a material thickness throughout all portions of the device characteristic of the sheet material; and/or folds, bends or the like which if reversed would result in a planar article. A device formed from a sheet material may also typically be rendered or represented as a two-dimensional pattern or outline on a sheet material.

A tensioning arrangement may be manufactured by bending a resilient sheet material, for example by roll-forming, pressing, stamping or the like. A sheet material may be bent, so as to form an attachment portion or portions, and/or an interlocking formation or formations (discussed in further detail below).

The method may comprise creating an outline of a tensioning element on a sheet of material, for example by precision processing (machining, laser cutting etc) or stamping, and subsequently conducting one or more steps of one or more of bending, roll forming, stamping and pressing the sheet material to form the tensioning element.

The method may comprise creating a plurality of tensioning elements from a single sheet of material.

The method may comprise creating an outline of one or more said tensioning elements, for example by stamping or machining "blanks" from a single sheet of material and then conducting the one or more steps of one or more of bending, roll forming, stamping and pressing the sheet material to form each tensioning element.

The sheet material or tensioning element may be machined and/or etched prior to bending.

The first, second, third and/or fourth tensioning arrangement may be formed integrally with the respective frame member. In some embodiments, the method may comprise bending a sheet material so as to form a frame member and a tensioning arrangement extending therefrom.

The method may comprise attaching the first, second, third and/or fourth tensioning arrangement to a respective frame member.

Accordingly, the invention extends in a second aspect to a method of making a frame for a printing screen assembly, comprising:

providing an elongate first frame member and an elongate second frame member; at least the first frame member having an abutment arrangement;

fixing the first frame member in parallel relation to the second frame member, wherein the abutment arrangement is are oriented away from the second frame member;

providing resiliently deflectable first and second tensioning arrangements, each having an attachment arrangement configured for attachment to a printing screen;

attaching the first tensioning arrangement to the first frame member and attaching the second tensioning arrangement to the second frame member;

whereby each tensioning arrangement extends in cantilevered relation to the corresponding frame member, wherein the first tensioning arrangement extends at a predetermined distance from the abutment arrangement of the first frame member.

The second frame member may comprise an abutment arrangement, oriented away from the first frame member, and the method may comprise attaching the second tensioning arrangement to the second tensioning element whereby the second tensioning element extends at a predetermined distance from the abutment arrangement of the second frame member.

The method of may comprise providing elongate third and fourth frame members, third and fourth tensioning arrangements and attaching the tensioning arrangements to corresponding frame members.

The method may further comprise joining the frame members, directly or via corner pieces as disclosed herein.

By making the frame members and the tensioning arrangements separately and attaching in this way, each may be optimised according to particular requirements. For example, different materials, or different material thicknesses or properties may be required for the frame members and the tensioning arrangements. This method of construction may also facilitate subsequent disassembly and reuse of at least the frame members.

A tensioning arrangement may be attached to a frame member by any suitable method, such as welding, bonding, by way of fixings (bolts, rivets etc) or by an interlocking arrangement, such as inserting a part of the tensioning arrangement into a slot or channel. A tensioning arrangement may be attached to a frame member and retained thereto by friction. A tensioning arrangement may be attached to a frame member and retained thereto by flexing, for example of a part of the frame or a part of the tensioning arrangement.

A tensioning arrangement may be removable or replaceable.

An interlocking arrangement may comprise a tensioning element interlocking formation at or near the fixed end of a said tensioning element, such as a lip or tab, and a corresponding slot, channel or recess in the frame member, wherein the slot, channel or recess comprises a frame member interlocking formation adapted to engage the tensioning element interlocking formation.

A given tensioning arrangement may comprise more than one tensioning element interlocking formation.

In embodiments wherein the tensioning arrangement is attached to the frame member at least in part by friction, flexing and/or an interlocking arrangement, the attachment between a said tensioning arrangement and a said frame member may be configured to increase engagement between the frame member and tensioning arrangement when the tensioning arrangement is resiliently deflected. Thus, the method may comprise increasing the engagement between at least one tensioning arrangement (e.g. an element interlocking formation thereof) and at least one frame member (e.g. an interlocking formation or slot/channel thereof) by resiliently deforming the first, second, third and/or fourth tensioning arrangement.

The method may comprise attaching the first, second, third and/or fourth tensioning arrangement to the respective frame member by inserting a part of at least one said tensioning arrangement into a slot, channel or recess defined by the respective frame member.

A part of the tensioning arrangement, such as the tensioning element interlocking formation, may be inserted into said slot, channel or recess by moving the tensioning arrangement generally towards the frame member. Inserting a part of the tensioning arrangement into the slot/channel/recess may comprise resiliently deforming the tensioning arrangement, such as an interlocking formation thereof. Such resilient deformation may be relieved or removed when the at least one tensioning arrangement is fully inserted. The slot may be tapered in width to facilitate such insertion.

The part of the tensioning arrangement may be inserted into said slot, channel or recess by moving the at least one tensioning arrangement generally along the frame member, for example along said slot/channel/recess. The method may comprise inserting the part of at least one said tensioning arrangement from one end of the elongate frame member.

The tensioning arrangement may be inserted into said slot, channel or recess generally normal to a length of the slot, channel or recess.

Each frame element may comprise a single slot, channel or recess, or multiple slots, channels or recesses.

As mentioned above, each frame member may comprise an abutment arrangement comprising a single abutment or more than one abutment.

An abutment arrangement may comprise a linear abutment extending along said length of the frame member. An abutment arrangement may comprise co-linear abutments extending along said length of the frame member. As such, the corresponding tensioning arrangement in use may be resiliently deflected by the same amount along the length of the frame member.

In some embodiments, an abutment formation comprises a non-linear abutment, or non-colinear abutments, such that a tensioning arrangement may be deflected to differing degrees along the length of the frame member.

By linear and co-linear, we refer to a direction along a length of the respective elongate frame member and so parallel with the plane of the printing screen of the resulting screen assembly and typically parallel to the edge of the printing screen.

The method may comprise casting, machining and/or extruding each frame member. In some embodiments, the frame members are formed from an extruded plastics material, or an extruded metallic material, such as aluminium.

The method may comprise forming each frame member from a sheet material. The method may comprise bending a sheet material and or welding sheet material to form a frame member, for example of generally hollow construction.

The method may comprise creating an outline of a frame member on a sheet of material, for example by precision processing (machining, laser cutting etc) or stamping, and subsequently conducting one or more steps of one or more of bending, roll forming, stamping and pressing the sheet material to form the frame member.

The method may comprise creating a plurality of frame members from a single sheet of material.

The method may comprise creating an outline of one or more said frame members, for example by stamping or machining "blanks" from a single sheet of material and then conducting the one or more steps of one or more of bending, roll forming, stamping and pressing the sheet material to form each frame member.

The sheet material or blank may be machined and/or etched prior to bending. For example, to create one or more lines of weakness to facilitate bending may be machined prior to bending.

As disclosed herein a frame member may comprise one or more apertures, to facilitate insertion of a deflecting element, or insertion or removal of a tensioning arrangement. In some embodiments, the method may comprise creating, for example by machining or stamping, one or more or an array of apertures in the sheet material or blank(s).

The method may comprise forming the respective tensioning arrangement integrally with the frame member.

The method may comprise constructing the frame.

Constructing the frame may comprise fixing the first and second frame members parallel to and spaced apart from one another.

The first and second frame members may each be fixed onto a base frame.

The first and second frame members may each be fixed, generally at the ends thereof, to an intermediate frame member.

In some embodiments, constructing the frame may comprise fixing the third and fourth frame members parallel to and spaced apart from one another, and orthogonal to the first and second frame members.

The first, second, third and fourth frame members may each be fixed onto a base frame.

The first and second frame members may be fixed to the third and fourth frame members, directly, or via a corner connector.

The frame members may be bonded or welded to one another, optionally via a corner connector.

In some embodiments, one or both ends of each frame member may be mitred, and the mitred ends bonded, welded or otherwise joined together.

The steps of constructing the frame and, in embodiments having tensioning arrangements that are not integrally formed with the frame members, attaching the tensioning arrangements to the respective frame members, can be conducted in any sequence.

In some embodiments, for example wherein each tensioning arrangement is attached to each frame member by sliding along a channel or slot defined by the respective frame member, one or both ends of the channel or slot may be blocked when the frame has been constructed (so as to at least in part retain the tensioning arrangement). In such embodiments, the tensioning arrangement may be attached to the respective frame member before said frame member is fixed in position so as to block said channel or slot.

In some embodiments, the frame, or each frame member, comprises one or more access apertures, to facilitate insertion or removal of a tensioning arrangement from the frame.

Each frame member may comprise a reference edge, which in use defines the level of an edge of the printing screen of the printing screen assembly.

The reference edge of the first and second frame members (and of the third and fourth frame members where present) may be co-planar.

Each reference edge may be a surface, lip or ridge.

In the at-rest position, the attachment portion of the tensioning arrangement may be out of plane with the reference edge of a respective frame member. Resiliently deflecting the tensioning arrangement may generally pivot the tensioning element(s) to bring the attachment portion into, closer to, or through and past the plane of the reference edge.

The method may comprise bringing the printing screen into contact with the/each reference edge and then securing the printing screen. The method may comprise bringing the printing screen into contact with the/each reference edge and bending a portion of the printing screen extending beyond the reference edge into contact with the/each attachment portion.

In some embodiments the method may comprise releasing the pre-tensioning force, whereby the printing screen is brought into contact with the reference edge.

The method may comprise creating a printing pattern on the printing screen.

In some embodiments the screen is a mesh emulsion screen, and the pattern is created by applying a layer of a photosensitive polymer-precursor solution or suspension to the mesh, And selectively curing the polymer-precursor to form a polymer mask; as known to one skilled in the art.

In some embodiments, the screen is formed of a sheet material (such as a polymer sheet or a metal sheet such as a stainless steel sheet) and the method may comprise precision cutting a printing pattern. Precision cutting may comprise laser cutting. Other precision cutting methods may be employed (such as water jetting, plasma cutting etc).

The method may comprise securing the printing screen and then creating the printing pattern or, more typically, creating the printing pattern and then securing the printing screen.

Securing the printing screen to the attachment portion of the first tensioning arrangement and securing the printing screen to the attachment portion of the second tensioning arrangement (and optionally the third and fourth tensioning arrangements) may comprise welding, bonding with adhesive, or the printing screen may be secured by hooks to each said attachment portion. Securing the printing screen may comprise riveting.

Welding may comprise laser welding. Conveniently, wherein a laser is used to create the printing pattern, the same laser may be used to weld the printing screen to said attachment portions.

Any suitable welding pattern may be used, including a line, multiple lines (in series or parallel) or a series of spot welds.

The printing screen may comprise a hook extending along a length of the printing screen corresponding substantially to the length along which each tensioning arrangement extends.

The method may comprise hooking each hook to the respective attachment portion of each tensioning arrangement.

That is to say, the printing screen may comprise a first and a second hook and optionally a third and a fourth hook. It will be understood that in embodiments wherein the hook is integral to the screen or attached thereto prior to securing the screen to the tensioning arrangements, said hooks will be spaced apart allow opposed hooks to be secured when the pre-tensioning force(s) is/are applied, but not when the respective opposed (first and second, optionally third and fourth) tensioning arrangement are in their at rest positions.

The hooks may be integral to the printing screen. The hooks may be formed for example by bending along an edge of the printing screen sheet material.

The method may comprise coupling the hooks to the printing screen. Separate hooks may be formed from a different material, or thickness/strength of material than the printing screen, which may facilitate the screen being robustly secured to the attachment portions, for example in when using very thin printing screens.

The hooks may be coupled by any suitable method, including bonding, welding, riveting or the like.

Conveniently, in embodiments wherein the printing pattern is created using a laser, and/or wherein a laser is used in other parts of the method (for example laser welding of the attachment portions and the screen, laser processing of the tensioning arrangements, joining of the frame members via laser welding) the hooks may be laser welded to the printing screen, using the same laser.

In some embodiments, both the screen and the hooks may be welded or bonded to the attachment portions, so as to provide additional strength.

The method may comprise constructing a printing screen assembly for a generally square or rectangular printing screen.

The method may comprise cutting the printing screen to size, optionally in situ on the frame. For example, the printing screen may be provided on a larger sheet or roll of material or mesh and cut to size.

In embodiments comprising laser welding and/or cutting (or another form of cutting or welding) the method may comprise using the same apparatus for welding, creating the printing pattern and/or cutting the printing screen to size.

According to a third aspect of the invention there is provided a method of making a frame for a printing screen assembly, comprising:

providing an elongate first frame member and an elongate second frame member parallel to the first frame member and in fixed relation thereto; each frame member having a corresponding cantilevered first and tensioning arrangement extending from each frame member along a length thereof;

the method comprising forming the first tensioning arrangement and the second tensioning arrangement from a resilient sheet material, and preselecting the resilience of the first and/or the second tensioning arrangement (so as to preselect the tension applied when tensioning a printing screen in use, as disclosed herein) by removing material from the resilient sheet material, machining and/or etching the resilient sheet material.

The invention further extends in a fourth aspect to a method of constructing a printing screen assembly, comprising; making a frame by the method of the third aspect (or providing a frame in accordance with the seventh aspect discussed below); applying a pre-tensioning force to resiliently deflect the first tensioning arrangement towards the second frame member (and optionally the second tensioning arrangement towards the first frame member);

securing a printing screen to an attachment portion of the first tensioning arrangement, while the first and optionally also the second tensioning arrangement is pre-tensioned;

securing the printing screen to an attachment portion of the second tensioning arrangement; and releasing the pre-tensioning force from the first tensioning arrangement (and, if pre-tensioned, the second, arrangement) so as to apply tension to the printing screen.

It will be understood that the frame may comprise third and fourth frame members and corresponding tensioning elements.

The method may comprise selectively reducing the thickness of the resilient sheet material.

The method may comprise cutting one or more slots, cut-outs or apertures into or from the sheet material.

The method may comprise precision processing, such as laser machining or etching, of the resilient sheet material, to selectively reduce thickness or cut slots, cut-outs or apertures.

In some embodiments, the method may comprise varying the resilience of the first and/or second tensioning arrangement, along said length of the respective frame member.

A tensioning arrangement may be manufactured by bending a resilient sheet material, for example by roll-forming, pressing, stamping or the like.

The sheet material may be machined and/or etched prior to bending.

The method may comprise forming the at least one first and/or second tensioning arrangement and then attaching to a respective frame member.

The method may comprise providing the each of the said tensioning arrangements with a tensioning element interlocking formation, providing each frame member with a corresponding interlocking formation; and attaching each tensioning element interlocking formation to a corresponding frame member interlocking formation.

The method may comprise attaching the first and/or second tensioning arrangement to the respective frame member by inserting a part of the tensioning arrangement, such as a part extending from an edge thereof or the tensioning element interlocking formation(s), into a slot, channel or recess defined by the frame member.

Each tensioning element interlocking formation may be inserted into said slot, channel or recess by moving the at least one tensioning element generally along the frame member, for example from one end of the elongate frame member.

Each frame member may comprise a single slot, channel or recess, or multiple slots, channels or recesses, sized to receive a part of a tensioning arrangement, such as an interlocking formation thereof.

Each frame member may comprise an abutment arrangement extending along a length of the frame member. The abutment arrangement may be disposed in relation to the at least one frame member interlocking formation so that, when a tensioning element interlocking formation of a said tensioning arrangement is attached thereto, in use a predictable pre-tensioning force can be applied to the tensioning arrangement by resilient deflection thereof into contact with the abutment arrangement.

The method may comprise constructing the frame.

Constructing the frame may comprise fixing the first and second frame members parallel to and spaced apart from one another.

The frame may comprise third and fourth elongate frame members and corresponding third and fourth tensioning arrangements. The steps disclosed herein in relation to the first and second elongate frame members and tensioning arrangements apply to the third and fourth frame members and tensioning arrangements.

The various steps may be conducted in any suitable sequence.

The method may comprise making the frame members. Each frame member may be made by machining and/or extruding. In some embodiments, the frame elements are formed from an extruded plastics material, or an extruded metallic material, such as aluminium.

The method may comprise extruding each frame member to form an elongate frame member having at least one abutment arrangement and at least one frame member interlocking formation.

Each frame member may be formed from a sheet of material, such as steel, by rolling, pressing, folding and the like.

Further optional steps of the methods of the first through fourth aspects correspond to those disclosed in relation to any other of the first through fourth aspects of the invention.

In a fifth aspect, the invention extends to a printing screen assembly, comprising:

a frame having an elongate first frame member and an elongate second frame member parallel to the first frame member and in fixed relation thereto;

a cantilevered first tensioning arrangement and a cantilevered second tensioning arrangement extending from each respective frame member along a length thereof; each tensioning arrangement comprising an attachment portion at or towards a free end thereof along the said length;

wherein the first frame member comprises a first abutment arrangement; wherein the first tensioning arrangement is operable to be resiliently deflected towards the second frame member into contact with the first abutment arrangement; and a printing screen attached to the attachment portions of the first and second tensioning arrangements and held in tension therebetween.

The tension in the printing screen is determined by the amount of pre-tensioning applied to the first tensioning arrangement, when it is deflected into contact with the abutment arrangement, when the screen is attached.

The length of the respective frame member along which the tensioning arrangement extends corresponds the length of an edge of the tensioned printing screen.

The second frame member may comprise a second abutment arrangement; wherein the second tensioning arrangement is operable to be resiliently deflected towards the first frame member into contact with the second abutment arrangement.

The frame may comprise an elongate third frame member and an elongate fourth frame member parallel to the third frame member; and a corresponding cantilevered third and fourth tensioning arrangement extending from the third and further frame members along a length thereof; each tensioning arrangement comprising an attachment portion at or towards a free end thereof along the said length;

wherein the third and fourth frame members extend generally between and orthogonal to the first and second frame members;

wherein the third frame member comprises a third abutment arrangement; wherein the third tensioning arrangement is operable to be resiliently deflected towards the further frame member into contact with the third abutment arrangement; and the fourth frame member comprises a fourth abutment arrangement; wherein the fourth tensioning arrangement is operable to be resiliently deflected towards the third frame member into contact with the fourth abutment arrangement;

wherein the printing screen attached to the attachment portions of the third and fourth tensioning arrangements and held in tension therebetween.

The printing screen may be formed of a sheet material, such as stainless steel.

The printing screen may be welded (e.g. laser welded) or bonded, or riveted to the attachment portions.

The printing screen may be secured by hooks to each said attachment portion.

The hooks may be integral to the printing screen, for example formed by bending along an edge of the printing screen sheet material.

The hooks may be bonded, welded (e.g. laser welded), riveting etc to the printing screen.

In a sixth aspect of the invention there is provided a frame for a printing screen assembly; the frame comprising:

an elongate first frame member and an elongate second frame member parallel to the first frame member and in fixed relation thereto;

a cantilevered first tensioning arrangement and a cantilevered second tensioning arrangement extending from each respective frame member along a length thereof; each tensioning arrangement comprising an attachment portion at or towards a free end thereof along the said length, for attachment to a printing screen;

wherein the first frame member comprises a first abutment arrangement; wherein the first tensioning arrangement is operable to be resiliently deflected towards the second frame member into contact with the first abutment arrangement.

The second frame member may comprise a second abutment arrangement; wherein the second tensioning arrangement is operable to be resiliently deflected towards the first frame member into contact with the second abutment arrangement.

The frame may comprise an elongate third frame member and an elongate fourth frame member parallel to the third frame member; and a corresponding cantilevered third and fourth tensioning arrangement extending from the third and further frame members along a length thereof; each tensioning arrangement comprising an attachment portion at or towards a free end thereof along the said length, for attachment to a printing screen;

wherein the third and fourth frame members extend generally between and orthogonal to the first and second frame members;

wherein the third frame member comprises a third abutment arrangement; wherein the third tensioning arrangement is operable to be resiliently deflected towards the further frame member into contact with the third abutment arrangement; and the fourth frame member comprises a fourth abutment arrangement; wherein the fourth tensioning arrangement is operable to be resiliently deflected towards the third frame member into contact with the fourth abutment arrangement.

Each tensioning arrangement comprises at least one tensioning element which extends from a fixed end, coupled to the respective frame element, to a free end.

The attachment portion of each tensioning element may be at or proximal to the free end of each tensioning element.

Each attachment portion may be configured to be attached to a printing screen when the tensioning arrangement is deflected into contact with the corresponding abutment arrangement. It will be appreciated that each of the tensioning elements will tend to pivot around the fixed end when deflected, such that the orientation of the attachment portion may change. Thus, the attachment portions may be optimally oriented for attachment to a printing screen when the respective tensioning arrangement is deflected into contact with the abutment arrangement.

The or each tensioning arrangement may comprise, or be formed from, a resilient sheet material such as a stainless steel. The tension applied by at least one of the first and second tensioning arrangement (and where present, the third and fourth tensioning arrangement) may be independently preselected by selection of the material properties of the sheet material (such as its thickness, resilience etc), removing material from the resilient sheet material, machining and/or etching the resilient sheet material.

Thus, at least one said tensioning arrangement may be of variable thickness. The characteristics of a sheet material that has been machined (e.g. CNC machined) or etched (e.g. using a laser) to selectively reduce its thickness in one or more regions thereof, will be readily apparent to one skilled in the art.

Alternatively, or in addition, one or more slots, cut-outs, apertures or the like may be cut into or from the sheet material, to thereby control bending characteristics.

One or more slots or cut-outs may be cut into or from the sheet material to define two more tensioning elements.

The pattern of slots, cut-outs, aperture and/or machining or etching may vary along the length of a tensioning arrangement; for example, to provide for increased tension in the middle of the printing screen.

The tensioning arrangements may be attached, optionally removably attached, to a respective frame member.

In some embodiments, the tensioning arrangements are attached to the frame members by an interlocking arrangement, and/or by insertion into a slot or channel, as disclosed herein.

An interlocking arrangement may comprise a tensioning element interlocking formation at or near the fixed end of a said tensioning element, such as a lip or tab, and a corresponding slot, channel or recess in the frame member, wherein the slot, channel or recess comprises a frame member interlocking formation adapted to engage the tensioning element interlocking formation.

Each frame member may comprise an elongate slot or channel, for receiving a part of a said tensioning arrangement, such as a tensioning element interlocking formation(s).

Each frame member may comprise an abutment arrangement comprising a single abutment or more than one abutment.

An abutment arrangement may comprise a linear abutment extending along said length of the frame member.

Each frame member may be cast, machined or extruded as a single piece. Each frame member may be formed from a sheet of material.

Each frame member may comprise a reference edge, which in use defines the level of an edge of the printing screen of the printing screen assembly.

The reference edge of the first and second frame members (and of the third and fourth frame embers where present) may be co-planar.

The frame may comprise frame members fixed to one another. For example, the frame members may be attached on to a base frame, or may be connected by corner connector, or may frame members may be directly connected to one another, around the frame; for example via mitred ends of the frame members.

In the at-rest position, and in some embodiments when attached to the printing screen, the attachment portion of each tensioning arrangement may be out of plane with the reference edge of a respective frame member.

The frame may further comprise, or be connectable to, an outer safety guard or guards, commonly referred to as a finger guard.

Printing screens may for some applications be extremely thin and fragile. In addition, the interface between the printing screen and the attachment portions may be relatively fragile and/or the screen may be prone to damage by unintended movement of the tensioning arrangements. The attachment portions and other regions of the tensioning arrangement and/or frame may also present sharp edges or other risks of cutting or pinching a user's hands.

The or each outer safety guard(s), or finger guard, may provide protection along for the attachment portions.

The or each outer safety guard may, in some embodiments be attached after the frame has been secured, or after the tensioning arrangements have been coupled to the frame.

The or each outer safety guard(s) may be attached in any suitable way, for example by clipping over or to the frame elements. An outer safety guard may take the form of a mesh, or a sheet (e.g. a folded sheet) of material, or the like.

The or each outer safety guard, or finger guard, may be formed from a sheet of material. Each outer safety guard may be formed integrally with other parts of the frame member; from the same sheet of material or blank.

The or each outer safety guard may be provided with one or more apertures. The apertures may provide access for a deflecting element to contact a corresponding tensioning arrangement.

In a seventh aspect, the invention extends to a frame for a printing screen assembly, comprising an elongate first frame member and an elongate second frame member parallel to the first frame member and in fixed relation thereto; each frame member having a corresponding cantilevered first and tensioning arrangement extending from each frame member along a length thereof;

wherein the first tensioning arrangement and the second tensioning arrangement are formed from a resilient sheet material, and wherein the resilience of the first and/or the second tensioning arrangement is preselected (so as to preselect the tension applied when tensioning a printing screen in use, as disclosed herein) by removing material from the resilient sheet material, machining and/or etching the resilient sheet material.

The invention extends in an eighth aspect to a printing screen assembly comprising the frame of the seventh aspect; and a printing screen attached to the attachment portions of the first and second tensioning arrangements and held in tension therebetween.

Where we refer to a structural feature being in fixed relation to another structural feature, we mean that the two structural features are rigidly connected, directly or indirectly, for example by one or more still further structural features.

The term "providing" includes merely acquiring or having, but may further include manufacturing or making.

The term resilient describes the property of a material or structure whereby it is capable of returning to its original shape following deformation (including deflection, bending, etc.). A resiliently deformable material or structure may be elastically deformable.

Where we refer to a structural feature being formed integrally with another structural feature, we mean that the structural features are formed from a single piece of material, such as a sheet or block of material. Formed integrally does not herein include structural features that are initially separate and then joined together, whether permanently or temporarily.

Terms referring to an orientation, such as upper, lower, above, below etc. refer merely to the orientation shown in the figures or, where stated, in use of the device and such term are not intended to be limiting.

Further preferred and optional features of each aspect of the invention correspond to preferred and optional features of any other aspect of the invention. In particular, where the methods disclosed herein refer to structural features, it will be understood that the apparatus disclosed herein may comprise any such structural features. Moreover, where the function or operation of the apparatus is disclosed, it will be understood that the method may comprise such steps of operation or function.

DESCRIPTION OF THE DRAWINGS

Non-limiting example embodiments will now be described with reference to the following figures in which:

FIG. 9 shows a cross sectional view of the frame member of a printing screen assembly and deflecting element, with the tensioning arrangement in contact with the abutment of the frame member and a printing screen having a hooked portion attached to an attachment portion of the tensioning arrangement;

FIG. 10 shows a cross sectional view of the frame member of the printing screen assembly of FIG. 9, during laser welding of the printing screen to the attachment portion;

FIG. 11 shows a cross sectional view of the frame member of a printing screen assembly and deflecting element, with the tensioning arrangement in contact with the abutment of the frame member, an elongate hook portion hooked around the attachment portion attachment portion of the tensioning arrangement and a printing screen positioned to be attached thereto;

FIG. 12 shows a cross sectional view of the frame member of the printing screen assembly of FIG. 11, during laser welding of the printing screen to the hook portion and the attachment portion;

FIG. 13 shows a cross sectional view of an alternative embodiment of a frame member;

FIG. 14 shows a plan view of a tensioning arrangement having an array of cut-outs, during manufacture thereof;

FIGS. 15 and 16 show plan view and cross sectional views of a tensioning arrangement having a region of reduced material thickness, during manufacture thereof;

FIG. 17 shows a plan view of a tensioning arrangement having multiple tensioning elements with cut-outs and reduced thickness regions providing preselected and variable tension along the length of the tensioning arrangement, during manufacture thereof;

DETAILED DESCRIPTION

Figure 1:
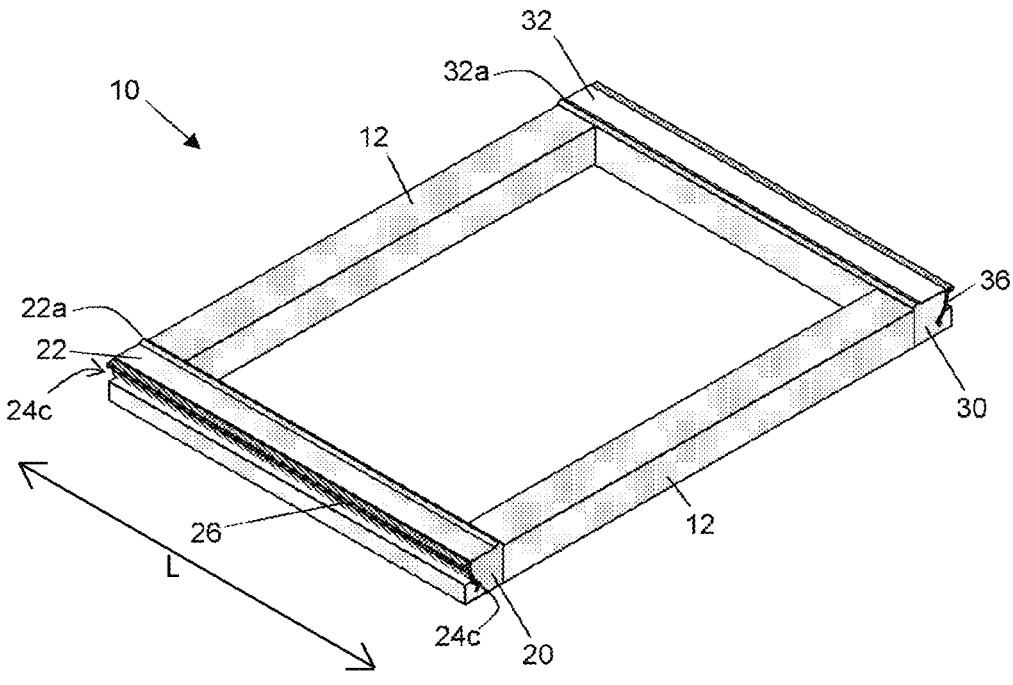
FIG. 1 shows a perspective view of an embodiment of a frame for a printing screen assembly.

FIG. 1 shows a frame 10 for a printing screen assembly. The frame includes an elongate first frame member 20 and an elongate second frame member 30. The frame members 20, 30 are held in fixed relation to one another by side members 12. The frame members 20, 30 are parallel to one another.

Figure 2:
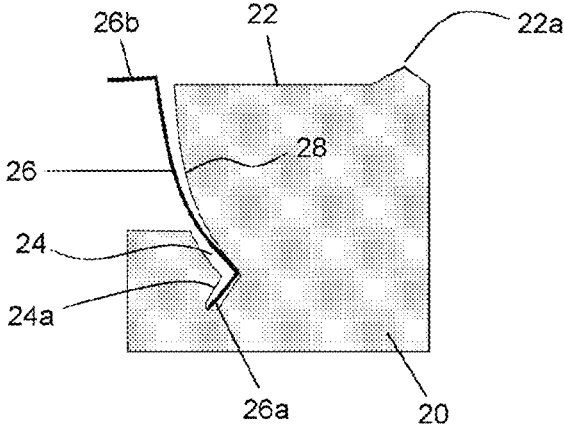
FIG. 2 shows a cross sectional view through a frame member of the frame of FIG. 1.

FIG. 2 shows a cross sectional view of the first frame member 20 in further detail. The upper end 22 of the frame member 20 defines a reference edge 22*a* along its upper side (in the orientation shown in the figure), to define the level of a printing screen in use. The references edges 22*a* and 32*a* of the first and second frame members 20, 30, are co-planar.

In alternative embodiments, the frame members do not include distinct reference edge formation 22*a*, 32*a* and the upper ends 22, 32 function as a reference edge.

Towards the outer edge (furthest from the second frame member 30), the frame member 20 defines a channel or slot 24, into which a tensioning arrangement, in the form of a single elongate tensioning element 26 is received. The tensioning arrangement is formed from a spring steel and methods of making thereof will be discussed in further detail below.

The tensioning element 26 is retained by an interlocking arrangement in the form of a lip 26*a* formed along the lower edge of the tensioning element 26, and a corresponding dog-leg portion 24*a* in the slot 24. The tensioning element interlocking formation (lip 26*a*) and the frame member interlocking formation (dog-leg 24*a*) engage with one another to retain the tensioning arrangement to the frame member 20.

The tensioning element 26 is inserted into the channel from an end 24*c* of the channel, generally along the length L of the frame member 20. In alternative embodiments (not shown), the tensioning arrangements can be inserted into the channel from the upper opening of the slot 24*b*. Such alternative means of attachment may require the tensioning element interlocking formation to deform during insertion.

At its upper end, an attachment portion 26*b* portion of the tensioning element 26 is formed as a platform or ledge for attaching a printing screen. Thus, the tensioning element is cantilevered and extends from a fixed end, where the interlocking formations 24*a*, 26*a* engage, to a free end, comprising the attachment portion 26*b*.

The frame member 20 further comprises an abutment arrangement, in the form of an elongate abutment 28 extending upwardly from the slot 24. The abutment 28 extends along the length of the frame member 20 and is profiled and positioned to contact the tensioning element 26 between the fixed and free ends thereof, when the tensioning element is resiliently deflected as discussed below.

In the "at-rest" position shown in FIG. 2, the free end 26*b* of the tensioning element 26 is spaced apart from the abutment 28.

Figure 7:
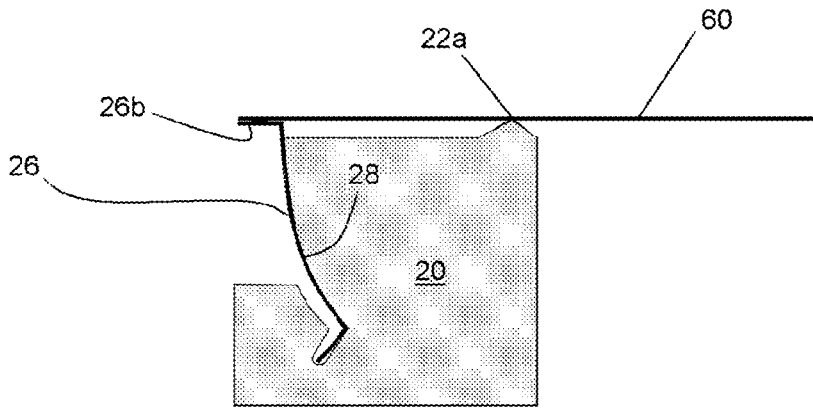
FIG. 7 is a cross sectional view through a frame member of a printing screen assembly.
Figure 8:
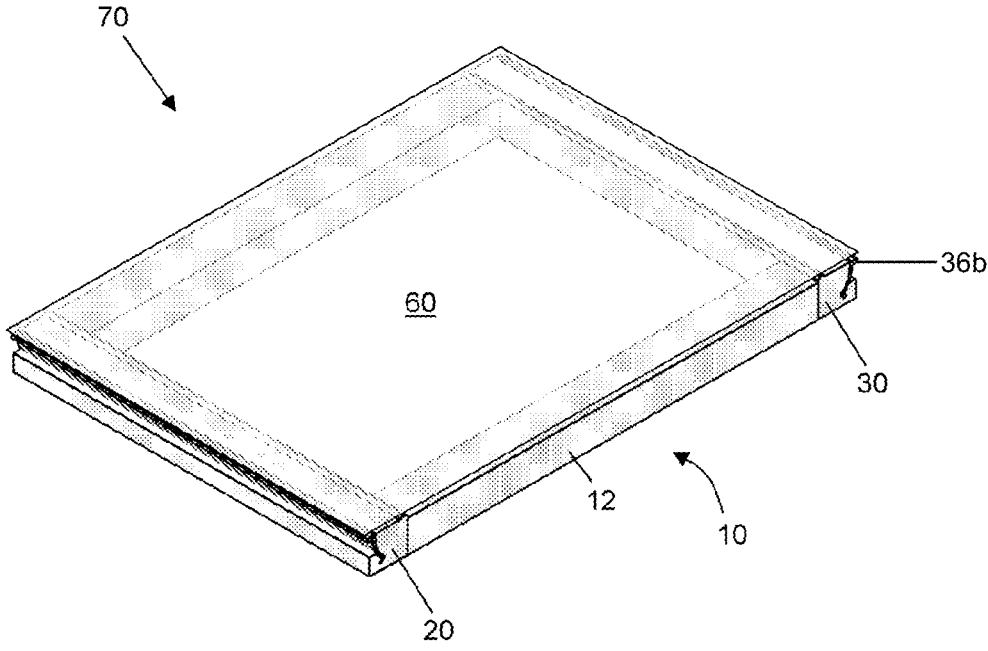
FIG. 8 is a perspective view of the printing screen assembly.

A screen assembly 70 is constructed as follows, with reference to the schematic perspective views shown in FIGS. 3, 5 and 8 and the schematic cross sectional views shown in FIGS. 4, 6 and 7.

Figure 3:
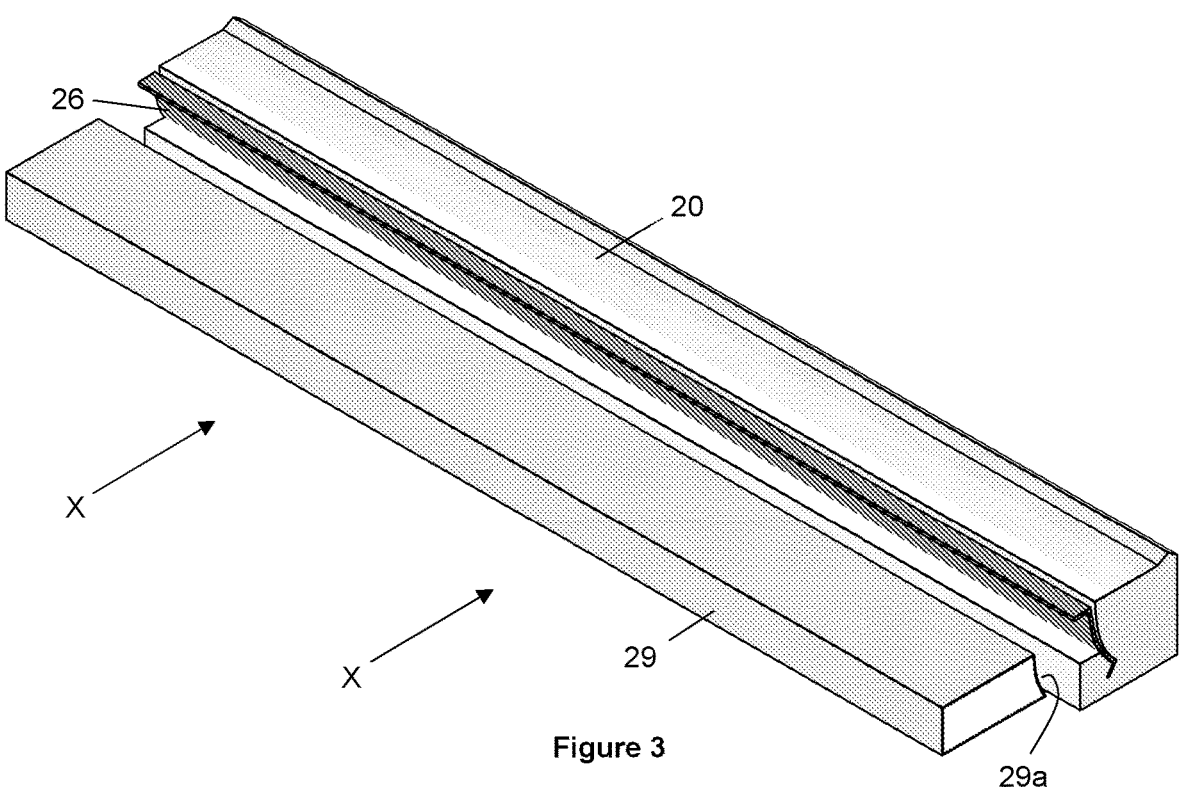
FIG. 3 shows a perspective view of the frame member and a deflecting element adjacent to the tensioning arrangement thereof.
Figure 4:
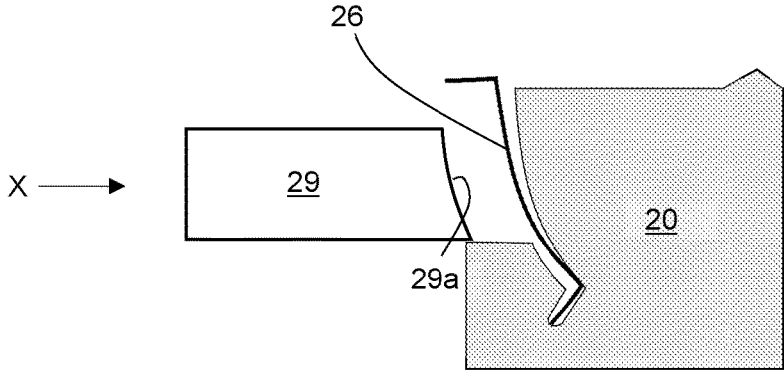
FIG. 4 shows a cross sectional view of the frame member and a deflecting element adjacent to the tensioning arrangement thereof.
Figures 5, 6:
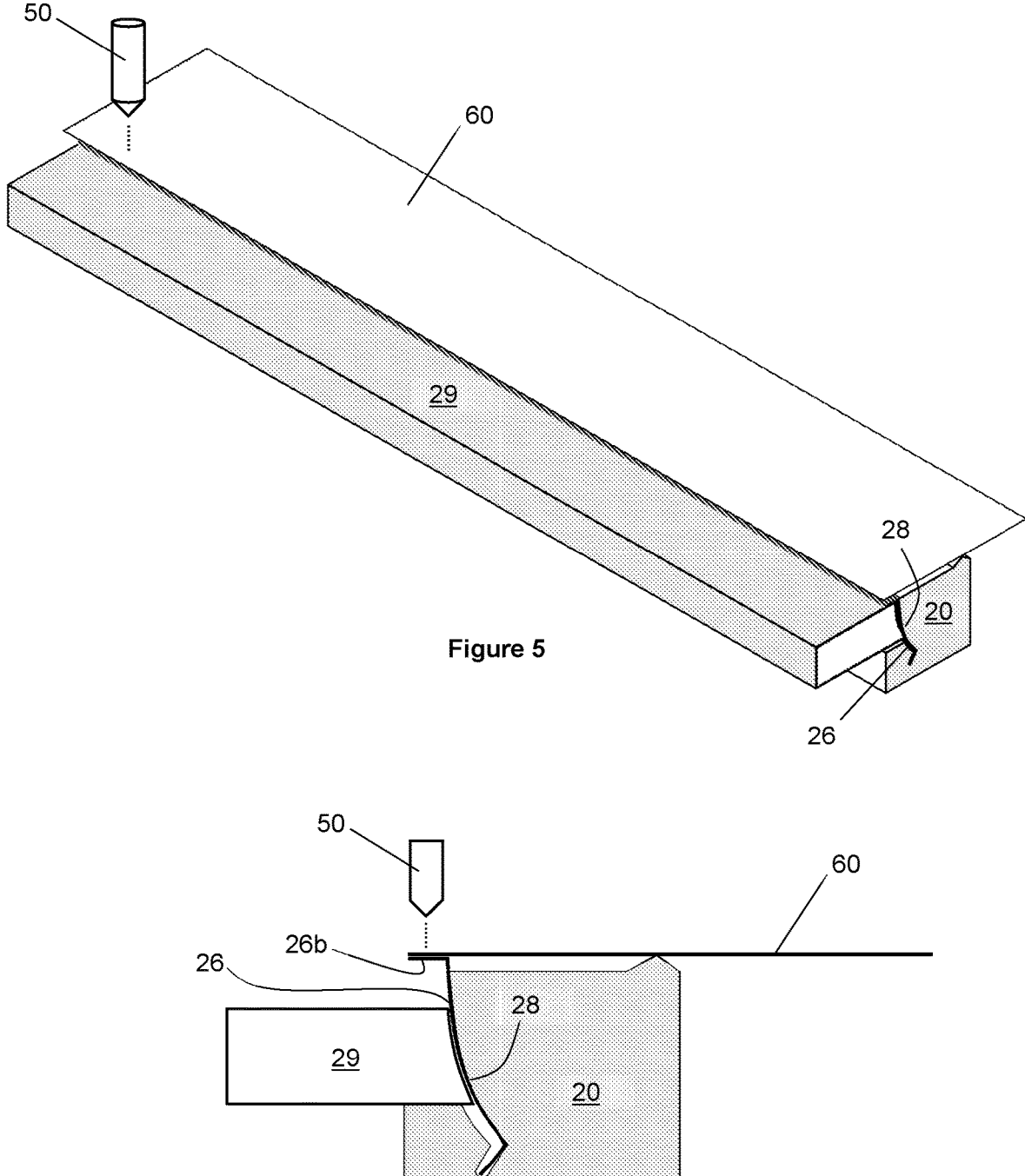
FIG. 5 shows a perspective view of the frame member and deflecting element, with the tensioning arrangement in contact with the abutment and a printing screen during attachment to the frame.
FIG. 6 shows a cross sectional view of the frame member and deflecting element, with the tensioning arrangement in contact with the abutment and a printing screen during attachment to the frame.

A pre tensioning force is applied to the tensioning arrangement 26, in the embodiment shown, by a deflecting element 29 (FIGS. 3 and 4). The deflecting element 29 has a face 29*a* which is profiled to have substantially the same curvature and orientation as the abutment 28. The deflecting member is moved in the direction X from the outside of the frame, towards the opposite end of the frame, thereby deflecting the tensioning element 26 towards the second frame member (i.e. inwardly) and into contact with the abutment 28 (FIGS. 5 and 6). It will be understood that in the example shown, a corresponding deflecting element is moved in the opposite direction –X towards from adjacent to the second frame member 30, to deflect the tensioning arrangement 36 inwardly towards the first frame member 20.

While in this position a printing screen 60 is placed over the frame 10, and attached along the attachment portions 26b, 36b by laser welding using a laser machining head 50. Spot or line welding may be used. The attachment portion 26b, 36b may be generally coplanar with, slightly out of plane (below, in the orientation shown) from, the reference edges 22a, 32a, so that the planarity of the printing screen can be accurately defined.

The deflecting elements 29 are then removed to release the pre-tensioning force, thereby tensioning the frame between the first and second tensioning elements 26, 36. The completed printing screen assembly 70 is shown in FIG. 8.

When the pre-tensioning force is released, the tensioning elements may spring back to some extent away from the abutments, towards the at-rest positions. The extent of any such spring back may depend on the material used for the printing screen. For example, whereas a stainless steel screen will exhibit minimal spring back, a greater degree may be observed for plastics sheets or mesh printing screens.

The method is particularly susceptible to automation, for steps such as moving the deflecting elements so as to pre-tension the tensioning elements, positioning and attaching the printing screen etc.

A printing pattern can be provided on the printing screen by conventional means, such as laser cutting, emulsion methods or the like. Where laser processing is used to create the printing pattern the same laser machining head 50 may be used (either before or after attachment to the frame).

The frame may optionally be cut to size (e.g. from a larger sheet or roll), in situ, or may be provided in a pre-cut form.

FIG. 9 shows another embodiment of a printing screen 62, which has been roll-formed to create a hooked edge 62a. The screen 62 is attached to the frame by hooking the hooked edge 62a over the attachment portion 26b. The attachment portion is urged further into the hooked edge by the resilient biasing of the tensioning element 26 towards its at-rest position.

For providing additional strength to the attachment (as might be required for example for particularly highly tensioned screens), welding (or other means of bonding, riveting or the like) may be employed along the length of the attachment portion while the pre-tensioning force is applied, between the hooked edge 62a and the attachment portion, as shown in FIG. 10.

An alternative means of attachment of a printing screen 62' to the attachment portion 26b is shown in FIGS. 11 and 12. A separate, elongate, hook portion 62b is positioned over the attachment portion 26b at each end (or along each side) of the frame and the screen 62' placed over the hook portion 62b. The hook portions, screen and attachment portions are then laser welded together.

The thickness of the material, or indeed the material itself, of the hook portion may be selected independently of the screen. This may be of particular benefit for example with very thin printing screens.

In still further embodiments, the hook portions may be attached to the printing screen before the printing screen is attached to the frame. For example, where a mesh screen is used, a hook portion may be welded or otherwise bonded, and the printing screen (together with hooks) attached to the frame.

FIG. 13 shows a cross sectional view of a further embodiment of a frame member 80. The frame member 80 is pressed or roll formed form a sheet material, such as stainless steel and has a generally hollow box section construction, defining an elongate aperture 84. The Edges of the sheet material defining the aperture function as an interlocking formation 84a, for engagement with the lip 26a of the tensioning element 26. The face 88 extending upwardly from the aperture 84 functions as an abutment, in use. The upper apex 82 defines a reference edge. As the tensioning element 26 is deflected into contact with the abutment 88, the interlocking formations 26a, 84a will be urged further into engagement with one another.

In still further embodiments (not shown) the frame and tensioning element are co-formed from a sheet material, or the tensioning element may be welded, riveted or bolted to a frame member.

The skilled person will understand that the frame members (and side members) can be connected together to be in a fixed relationship to one another in a variety of ways, for example directly as shown in the figures or via corner pieces, or via a base frame defining a periphery of the frame, to which all are connected.

It will further be understood that while a tensioning arrangement of each frame member 20, 30, 80 comprising a single frame element is shown, in alternative embodiments, more than one tensioning element may be included, for example by cutting slots or crenulations along an edge of a sheet material. The tensioning elements may even be entirely separate from one another, in other embodiments.

The frame may be assembled in the manner disclosed herein, including forming the tensioning arrangements thereof by preselecting their resilience.

The resilience of the tensioning arrangements may be pre-selected by selectively removing material from a sheet material from which the tensioning element is made. In one example, as shown in FIG. 14, in order to selectively reduce an amount of pre-tensioning applied in use of a given frame member such as frame members 20, 30; a pattern of openings 91 is laser cut into a sheet material 90, as shown in FIG. 14. The sheet material is then folded or pressed along lines 94 and 96, to form an attachment portion 96b and a lip 96a, respectively.

A still further example is shown in FIG. 15, in which a region 113 of a sheet material 110 is selectively reduced in thickness by laser machining (see the cross section along A-A in FIG. 16), so as to selectively reduce the resilience of the resulting tensioning element. CNC machining, or other processing methods may alternatively be used. The sheet material is then folded along lines 114 and 116, to form an attachment portion 116b and a lip 116a, respectively.

In alternative embodiments, other patterns, or a combination of reduced thickness and cut-outs may be used. The amount of material removed may also vary along the length of the tensioning arrangement, as shown for example in FIG. 17, where both cut-outs 121 and laser etching 123 are employed, and wherein slots 125 are cut through to the edge of the sheet material above the fold line 126. The resulting tensioning arrangement 120 comprises a single interlocking formation 126a, and multiple tensioning elements 126 and attachment portions 126b along the opposite edge; the pre-tensioning applied thereto in use also varying along the length of the tensioning element.

Figure 18:
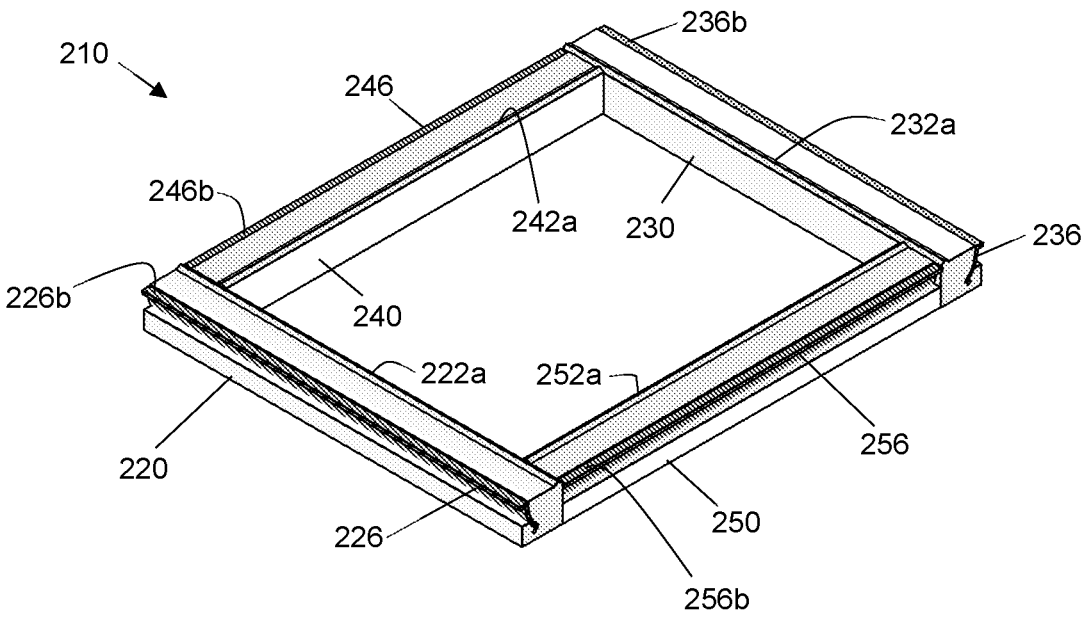
FIG. 18 is another embodiment of a frame for a printing screen assembly.
Figure 19:
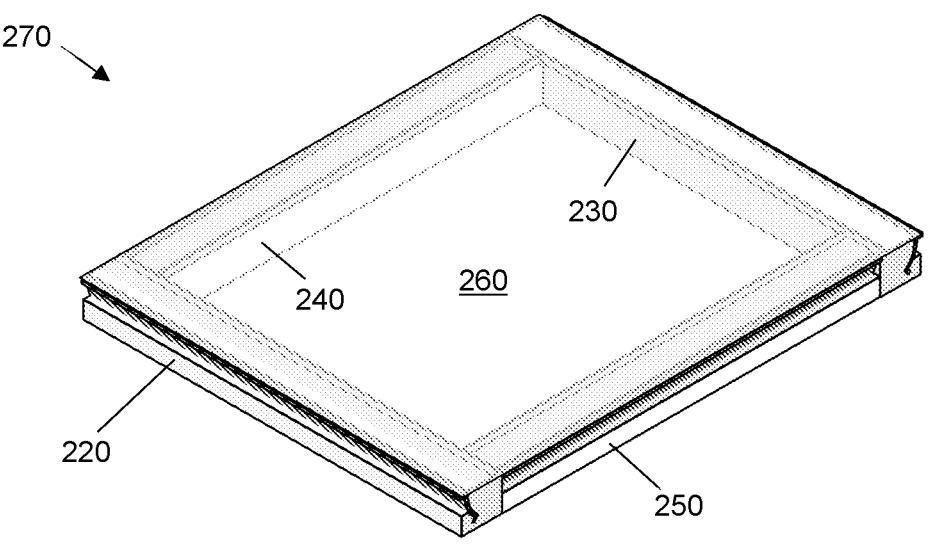
FIG. 19 is another embodiment of a printing screen assembly including the frame shown in FIG. 18.

FIG. 18 shows another embodiment of a frame 210 and FIG. 19 shows an embodiment of a printing screen assembly 270 with a printing screen 260 secured to the frame 210.

Features in common with the frame 10 and assembly 70 are provided with like reference numerals, incremented by 200.

The frame 210 and assembly 270 are similar to the frame 10 and assembly 70 and comprise first and second frame members 220 and 230, each having an elongate tensioning element 226, 236 extending therefrom along a length of each frame member. In addition, the frame 210 and assembly 270 include third and fourth frame members 240, 250, comprising respective third and fourth tensioning elements 246, 256 extending therefrom along a length of each frame member. The third and fourth frame members 240, 250 are parallel to one another and orthogonal to the first and second frame members 220, 230. The frame members 220, 230, 240, 250 are coupled to one another and their reference edges 222a, 232a, 242a and 252a are co-planar.

To secure the screen 260 to the attachment portions 226b, 236b, 246b, 256b, the tensioning elements 226, 236, 246, 256 are deflected inwardly into contact with respective abutments and, while the tensioning elements are in this position, the screen is welded to the attachment portions along the length of each; and thus along the edges of the screen and substantially around the periphery of the screen 260. The pre-tensioning force applied to deflect the tensioning elements can then be released. The screen 270 is thereby tensioned in two orthogonal directions.

Pre-tensioning forces can be applied, as described above in relation to the frame 10, by deflecting elements (not shown) which are moveable inwards in relation to the frame, from outside of all four frame members.

In alternative embodiments, the first and second tensioning elements are deflected and secured to the screen and the deflecting elements withdrawn; then the entire assembly rotated by 90 degrees such that the same deflecting elements can be used to apply a pre-tensioning force to the third and fourth tensioning elements, for securing corresponding attachment portions to the screen.

Figure 20:
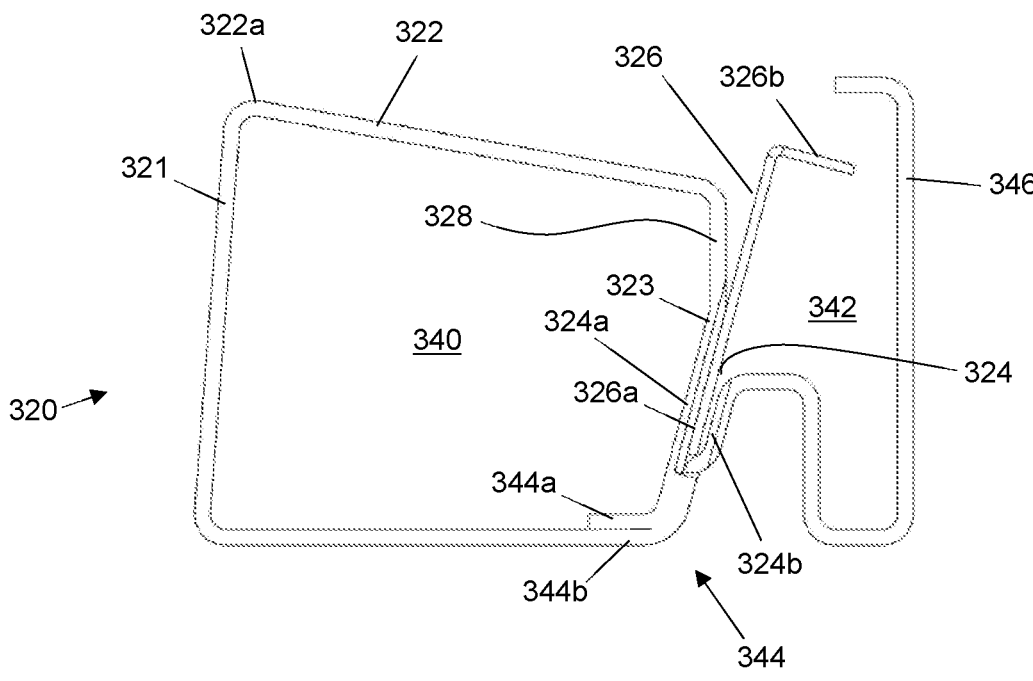
FIG. 20 is a cross sectional view along a further embodiment of a frame member.

FIG. 20 shows a cross sectional view of a further embodiment of a frame member 320, taken perpendicular to a length of the elongate frame member 320. The frame member 320 is formed from a sheet of material, such as steel. The frame member 320 includes a reference edge 322a, at an apex between an upper side 322 and an inner side 321 of the frame member, to define the level of a printing screen, in use. It will be understood that the level of the reference edges of first and second frame members, and typically also third and fourth frame members defining a frame will be co-planar (as illustrated for example in FIG. 23).

The frame member 320 defines a generally box-sectional portion, indicated generally as 340, extending to a safety guard portion (which may also be referred to as a "finger guard") indicated generally as 342. Defined therebetween is a slot 324.

A tensioning arrangement 326 is attached to the frame member 320, by insertion of the part 326a of the tensioning arrangement extending from its lower edge (in the orientation shown in the figure) into the slot 324. So attached, the tensioning arrangement has a fixed end 326a and a free end 326b configured for attachment to a printing screen as disclosed herein.

The fixed end 326a is retained in the slot by friction between the inner faces of the slot and the sheet material of the tensioning arrangement. Optionally, for example where removal of replacement of the tensioning arrangement would not be required, spot welding (for example using a laser) may be employed to retain or further retain the tensioning arrangement in the slot.

In alternative embodiments, the slot may be curved, kinked or convoluted and the fixed end, or part of the tensioning arrangement extending from the lower edge correspondingly configured, to function as interlocking arrangements.

The box-sectional portion 340 includes an overlap region 344 where two layers of the sheet material overlap. In the embodiment shown, the inner layer 344a is resiliently urged against the outer layer 344b, but spot or line welding, bonding or mechanical fixing may optionally be used.

The distance between the inner wall 324a and outer wall 324b of the slot 324 is substantially the same as the thickness of the sheet material of the tensioning arrangement 326. In alternative embodiments, the distance between the walls 326a and 326b may be slightly narrower so that they are urged slightly apart by the part 326a of the tensioning arrangement upon its insertion into the slot. The resilience applied between the overlapping layers of the box-sectional portion in such embodiments then act as a "clamping force" to assist in retention of the tensioning arrangement.

The outer side 323 of the box-sectional portion 340 (or of the frame member per se in embodiments lacking a finger guard) defines the inner wall 324a of the slot 324, and an abutment arrangement 328.

The abutment arrangement extends at an angle from the wall 324a of the slot, towards the outer side 321. In the embodiment shown, the abutment arrangement is generally vertical (in the orientation shown in the figures) but in alternative embodiments the abutment arrangement can be angled further towards or less far towards the outer side 321. The abutment arrangement may in other embodiments be curved, as disclosed herein.

The abutment arrangement 328 is spaced apart from the part of the tensioning arrangement 326 extending out of the slot 324, such that the free end 326b thereof is cantilevered.

The frame member 320 further comprises a safety guard 346 that extends around an outside of an assembled frame in use, and protects the outer edge of the printing screen; which can be sharp and capable of causing injury in some circumstances. The safety guard is provided with apertures (discussed in further detail below) to allow access for a deflecting element to deflect the tensioning arrangement, in use.

To make the frame member 320, a "blank" of the frame member 320 is made in a sheet of steel by laser cutting apertures (not shown) for aligning a deflecting element along a length of what will form the abutment arrangement 328, the access apertures along the length of what will form a safety guard and laser cutting an outline of the frame member pattern. In alternative embodiments, the apertures and outline may be mechanically or otherwise machined, or stamped from the sheet. The frame member is then roll formed, pressed and/or stamped into the required configuration, as known to one skilled in the art.

Figure 21:
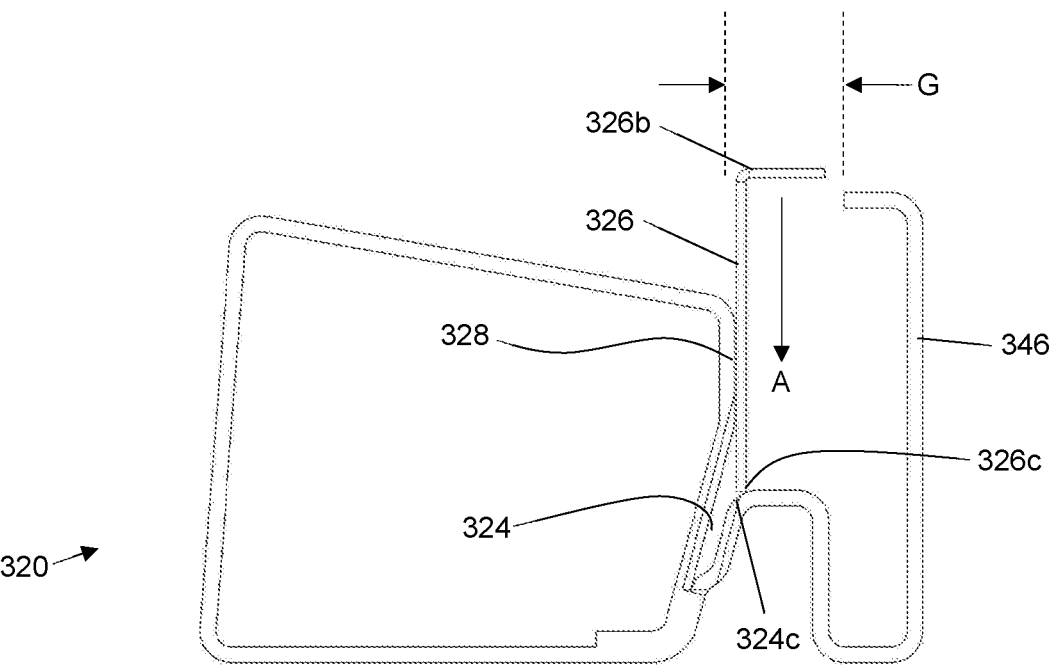
FIGS. 21 and 22 are cross section side views of the frame member of FIG. 20 illustrating attachment of a tensioning arrangement to the frame member.
Figure 22:
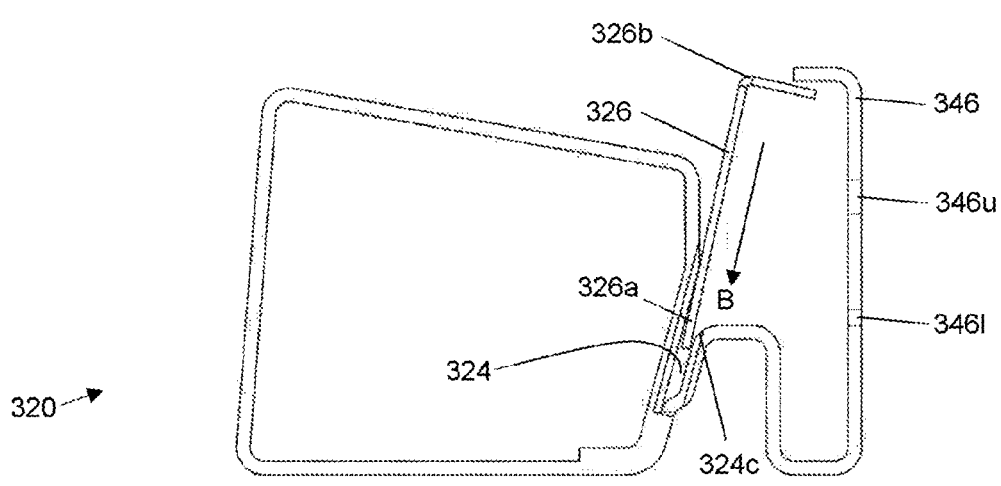

FIGS. 21 and 22 show cross sectional views of the frame member 320, during the process of attaching the tensioning arrangement 326 to the frame member 320.

The frame member 320 is configured such that the vertical gap G between the innermost part of the safety guard 346 and the abutment arrangement 328 allows room for the tensioning arrangement 326 to be inserted vertically therebetween, generally the direction A.

The lower edge 326c of the tensioning arrangement 326 contacts a ramped or curved surface 324c at the upper end of the slot 324, and is guided into the slot, flexing the tensioning arrangement 326 until the attachment portion 326b clears the top of the safety guard 346. As shown in FIG. 22, the attachment portion 326b of the tensioning element

326 can then be allowed to return to the "at rest" position, and the tensioning element inserted into the slot 324 generally in the direction B.

The safety guard can optionally be provided with lower apertures 3461, through which guide pins or rods (not shown) may be inserted to assist in flexing or guiding the lower part 326a of the tensioning arrangement over the ramped surface 324c and into the slot 324.

Attachment in this can be performed manually, or robotically, as known to one skilled in the art.

Figure 23:
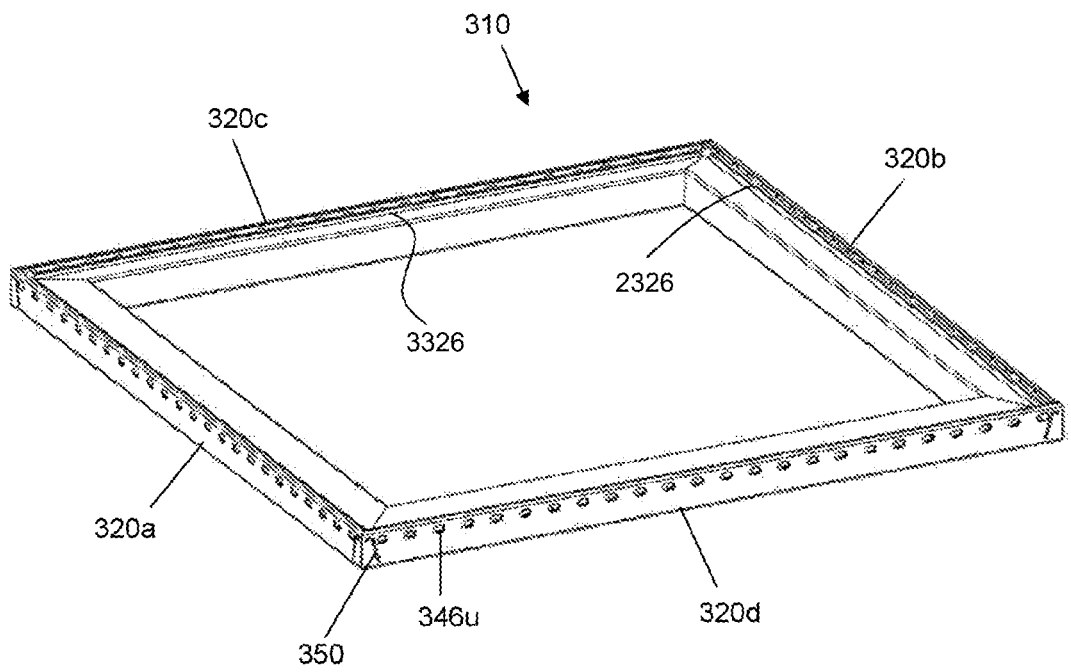
FIG. 23 is a perspective view of an embodiment of a frame for a printing screen assembly.
Figure 24:
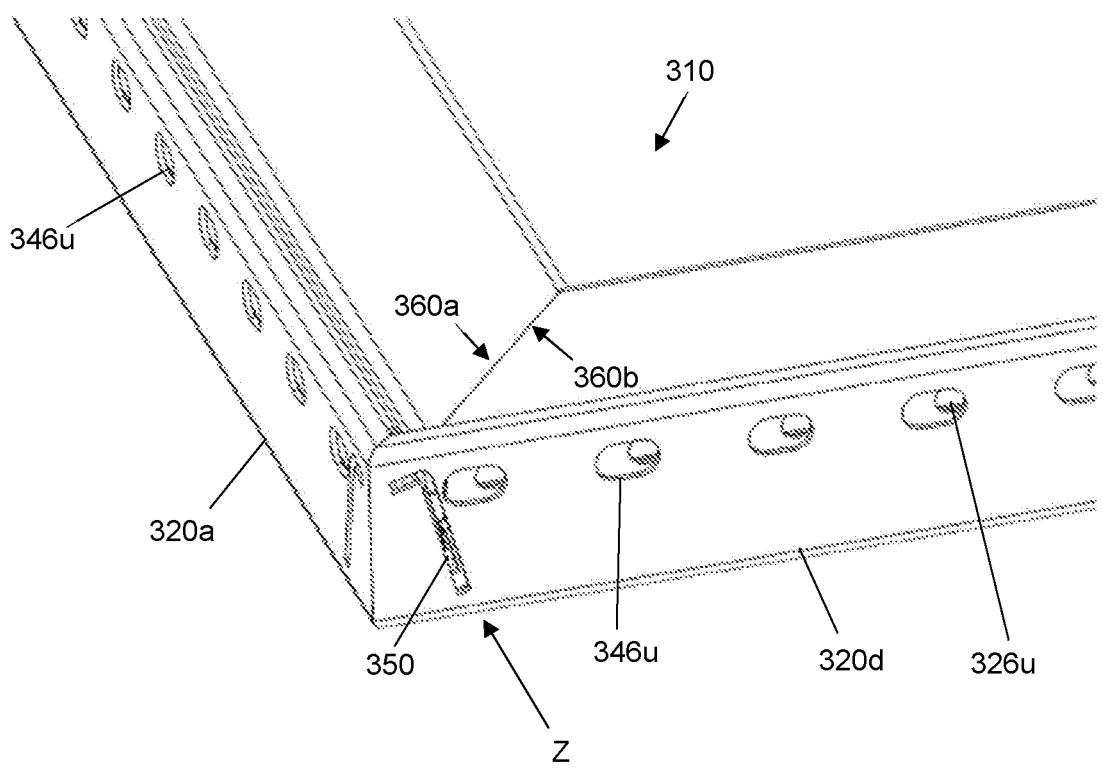
FIGS. 24 and 25 are detail perspective and side views of the frame of FIG. 23.

FIG. 23 shows a perspective view of a frame 310 for a printing screen assembly, comprising parallel first and second elongate frame members 320a and 320b, and parallel third and fourth frame members 320c and 320d. The frame members 320a, b, c, d are configured as described above in relation to the frame member 320. The frame members are attached to one another at welded, mitred corners (see FIG. 24) and thus in fixed relation to one another.

Visible along the outer safety guards of the respective frame members 320a-d are an array of upper apertures 346u, as well as an access slot 350 at each end of each frame member. Each frame member (members 320a and d are visible in FIG. 24) have mitred (i.e. diagonal) ends 360a, 360b. The ends of the frame members are welded along the accessible parts of the mitred ends, to attach the frame members to one another.

Figure 25:
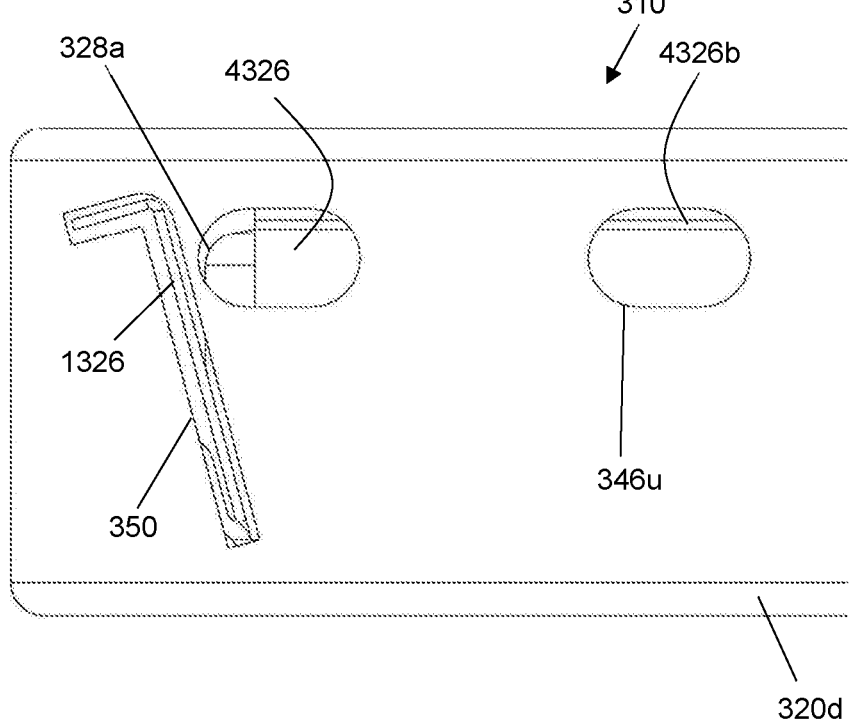

FIG. 25 is a side view of the frame 310 viewed in the direction Z. Visible through the apertures 426u in the outer safety guard of the fourth frame member 320d is the corresponding tensioning arrangement 4326, and the attachment portion 4326b thereof. Also visible through the aperture 346u furthest left in the figure, is the abutment arrangement 328a of the first frame member 320a.

Visible through the access slot 350 is the tensioning arrangement 1326 of the first frame member 320a. A corresponding slot is positioned through the safety guard of the third frame member 320c at the other end of the tensioning arrangement 1326.

Following attachment of the tensioning arrangements the safety guards may impede access thereto. The access slots 350 facilitate removal of the tensioning arrangements via the slots 350, by application of force to the tensioning arrangements along the length of the respective frame members through the slot 350 at the opposite side of the frame.

The tensioning arrangements 2326 and 3326 of the second and third frame members 320b and 320c are visible in FIG. 23. It will be understood that these can be attached to the respective frame members before, or after the frame members are attached to one another.

Figure 26:
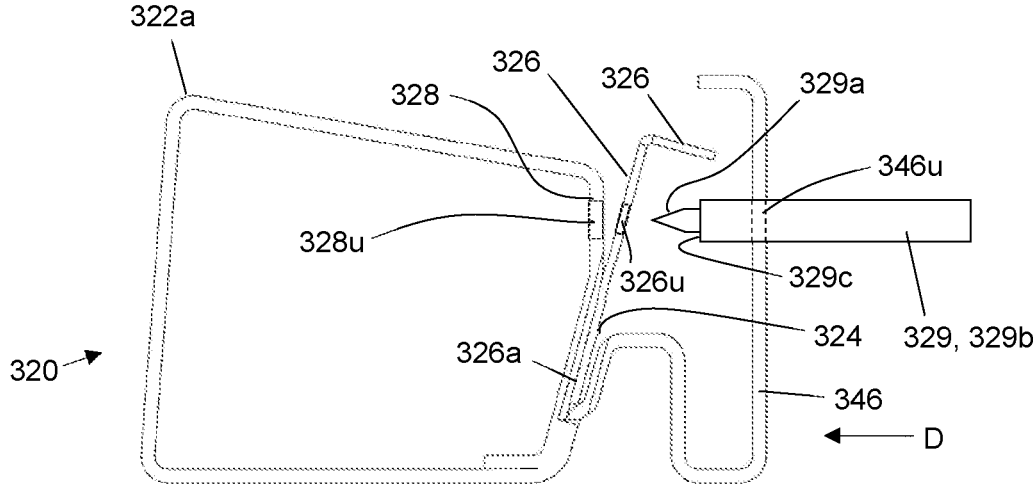
FIGS. 26 to 28 are cross sectional side views of the frame member of FIG. 20, illustrating deflection and pre-tensioning of the tensioning arrangement.
Figure 27:
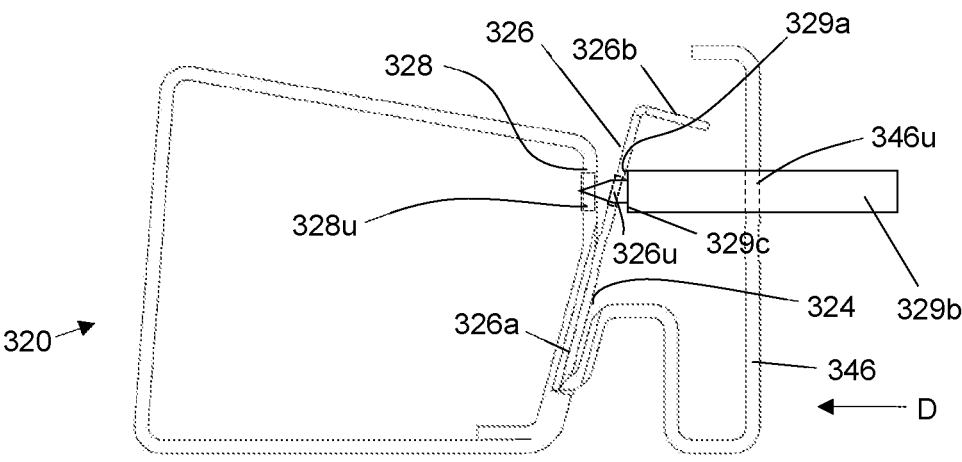

FIGS. 26 and 27 show cross sectional views of a frame member 320, and illustrate the pre-tensioning of the tensioning arrangement 326.

A deflecting element 329, in the form of a pin or rod, is introduced through the upper aperture 326u in the safety guard 326. It will be understood that the tensioning arrangement will in use be deflected by inserting an array of corresponding pins 329 through the array of apertures 346u along a length of the frame member 320. Typically, the deflecting elements will be introduced to opposite sides, or all four sides, of the frame 310 to simultaneously deflect the tensioning arrangements.

The pin 329 has a tapered tip portion 329a extending to a wider diameter rod portion 329b. A flange 329c extends around the tapered tip portion 329a at the distal end of the rod portion 329b. To deflect and pre-tension the tensioning arrangement 326, the rod 329 is advanced in the direction D such that the tip 329a extends through an upper aperture

326u through the tensioning arrangement 326, and the apertures 328u through the abutment arrangement 328, as shown in FIG. 27. Viewed along the direction D, the apertures 326u, 328u, and 346u are at substantially aligned.

Figure 28:
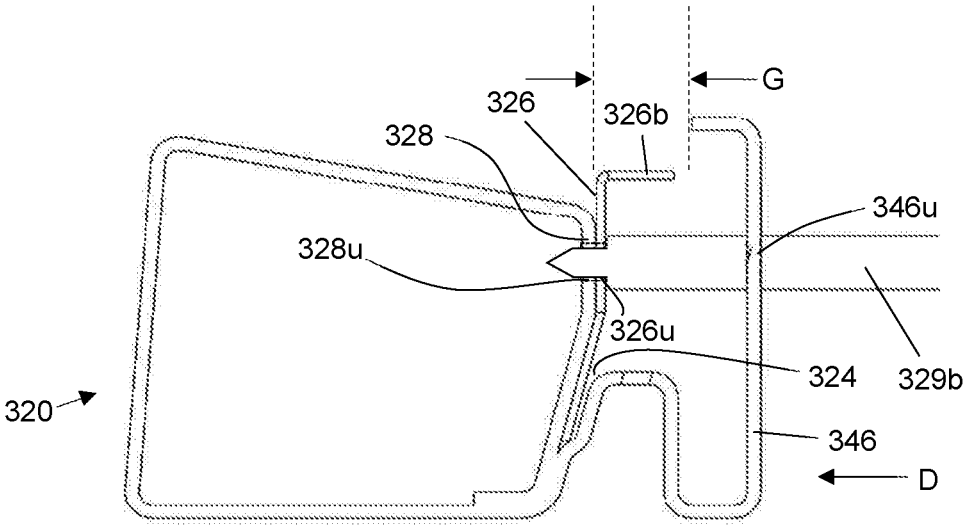

The aperture 326u is smaller in diameter than the rod portion 329b, such that the flange 329c abuts the tensioning arrangement 326 around the aperture 326u and deflects it towards and into contact with the abutment arrangement 328 as the rod 329 is advanced, as shown in FIG. 28.

The predetermined distance between the abutment arrangement 328 and the free end 326b of the tensioning arrangement 326 when the tensioning arrangement is in its "at rest" position as shown in FIG. 26 provides that when deflected into contact with the abutment arrangement 328 as shown in FIG. 28, a predetermined amount of elastic potential energy is stored in the tensioning arrangement 326.

In this pre-tensioned position, the attachment portion at the free end 328b of the tensioning arrangement is accessible via the gap G. Thus, a printing screen can be attached thereto, by any means as disclosed herein (for example as described above with reference to FIGS. 6, 7 and 9-12).

When the deflecting elements 329 are then withdrawn, the printing screen is placed in tension under the action of the resilient tensioning arrangements and the printing screen is drawn taut over the reference edges 322a.

Whilst exemplary embodiments have been described herein, these should not be construed as limiting to the modifications and variations possible within the scope of the invention as disclosed herein and recited in the appended claims.

The invention claimed is:

1. A method of constructing a printing screen assembly, the method comprising:
   providing a frame having an elongate first frame member and an elongate second frame member parallel to the first frame member and in fixed relation thereto; and a corresponding cantilevered first and second tensioning arrangement extending from each frame member along a length thereof;
   applying a pre-tensioning force to resiliently deflect the first tensioning arrangement towards the second frame member and into contact with a first abutment arrangement of the first frame member;
   securing a printing screen to an attachment portion of the first tensioning arrangement, while the first tensioning arrangement is in contact with the first abutment arrangement;
   securing the printing screen to an attachment portion of the second tensioning arrangement; and
   releasing the pre-tensioning force from the first tensioning arrangement so as to apply tension to the printing screen.

2. The method of claim 1, wherein securing the printing screen to the attachment portion of the second tensioning arrangement comprises resiliently deflecting the second tensioning arrangement towards the first frame member and into contact with a second abutment arrangement of the second frame member;
   securing the printing screen to an attachment portion of the second tensioning arrangement while the second tensioning arrangement is in contact with the second abutment arrangement; and
   releasing the pre-tensioning force from the second tensioning arrangement.

3. The method of claim 2, wherein the frame comprises an elongate third frame member and an elongate fourth frame member parallel to the third frame member; and a corresponding cantilevered third and fourth tensioning arrangement extending from each of the third and fourth frame members along a length thereof; wherein the third and fourth frame members extend generally between and orthogonal to the first and second frame members;

wherein the method further comprises:

applying a pre-tensioning force to resiliently deflect the third tensioning arrangement towards the fourth frame member and into contact with a third abutment arrangement of the third frame member; and applying a pre-tensioning force to resiliently deflect the fourth tensioning arrangement towards the third frame member and into contact with a fourth abutment arrangement of the fourth frame member;

securing a printing screen to an attachment portion of the third and the fourth tensioning arrangement, while the pre-tensioning force is applied thereto; and releasing the pre-tensioning force from the third tensioning arrangement so as to apply tension to the printing screen.

4. The method of claim 1, wherein the pre-tensioning force is applied to the first tensioning arrangement by use of a corresponding-deflecting element, the method comprising moving each deflecting element from a side of the respective frame member outside of the frame towards the said frame member.

5. The method of claim 1, comprising preselecting the tension applied by at least one of said first and second tensioning arrangements, wherein each tensioning arrangement comprises, or is formed from, a resilient sheet material and the tension applied by each tensioning arrangement is preselected by one or more of:

removing material from the resilient sheet material;

machining and/or etching the resilient sheet material so as to selectively reduce its thickness in one or more regions thereof; or selecting a distance between the tensioning arrangement in an at rest position and a corresponding abutment arrangement.

6. The method of claim 5, wherein one or more slots, cut-outs or apertures are cut into or from the sheet material, to thereby control bending characteristics of the or each tensioning arrangement.

7. The method of claim 5, comprising laser machining or etching of the resilient sheet material.

8. The method of claim 5, comprising varying the tension applied by at least one tensioning arrangement, along said length of the respective frame member.

9. The method of claim 1, wherein the first and second tensioning arrangements are manufactured by bending a resilient sheet material, so as to form an attachment portion or portions, and/or an interlocking formation or formations.

10. The method of claim 1, comprising attaching each tensioning arrangement by inserting a part of the tensioning arrangement into a slot or channel defined by each frame member.

11. The method of claim 10, wherein each tensioning arrangement comprises a tensioning element interlocking formation and each frame member comprises a corresponding frame member interlocking formation, and wherein each tensioning arrangement is attached via an interlocking arrangement comprising said tensioning element interlocking formation and frame member interlocking formation.

12. The method of claim 1, wherein the printing screen comprises a hook extending along a length of the printing screen corresponding substantially to the length along which each tensioning arrangement extends, wherein the method comprises hooking each hook to the respective attachment portion of each tensioning arrangement.

13. The method of claim 12, comprising coupling each hook to the printing screen.

* * * * *